(12) United States Patent
Cooley

(10) Patent No.: US 12,103,470 B2
(45) Date of Patent: Oct. 1, 2024

(54) SMART DISPLAY SHEETS

(71) Applicant: Cooley Enterprises, LLC, Houston, TX (US)

(72) Inventor: Maryam Cooley, Houston, TX (US)

(73) Assignee: Cooley Enterprises, LLC, Houston, TX (US)

( * ) Notice: Subject to any disclaimer, the term of this patent is extended or adjusted under 35 U.S.C. 154(b) by 0 days.

(21) Appl. No.: 18/178,182

(22) Filed: Mar. 3, 2023

(65) Prior Publication Data

US 2023/0382316 A1 Nov. 30, 2023

Related U.S. Application Data

(63) Continuation-in-part of application No. 17/824,715, filed on May 25, 2022, now Pat. No. 11,618,323.

(51) Int. Cl.
- *B60R 13/02* (2006.01)
- *G06F 1/18* (2006.01)
- *H05K 7/20* (2006.01)

(52) U.S. Cl.
CPC .......... *B60R 13/0237* (2013.01); *G06F 1/181* (2013.01); *H05K 7/20954* (2013.01)

(58) Field of Classification Search
CPC .............. B60K 35/00; B60K 2370/797; B60K 2370/816; B60K 2370/1533; B60K 2370/52; B60K 2370/794; B60K 2370/828; B60K 2370/46; B60K 2370/563; B60Y 2200/11

See application file for complete search history.

(56) References Cited

U.S. PATENT DOCUMENTS

| | | | |
|---|---|---|---|
| 8,169,182 B1 * | 5/2012 | Kimble | B60L 8/006 290/44 |
| 10,018,882 B2 | 7/2018 | Kwan et al. | |
| 10,417,941 B1 | 9/2019 | Green | |
| 11,161,747 B2 | 11/2021 | Guo | |
| 11,309,731 B1 | 4/2022 | Velez | |
| 2011/0258895 A1 | 10/2011 | Rodgers, Jr. | |
| 2016/0209681 A1 | 7/2016 | Hung | |
| 2018/0297540 A1 | 10/2018 | Juhasz | |
| 2019/0001888 A1 | 1/2019 | Labrot | |
| 2019/0130874 A1 | 5/2019 | Wafford | |
| 2019/0213931 A1 * | 7/2019 | Brubaker | B60Q 1/2607 |
| 2020/0033661 A1 | 1/2020 | Chien | |
| 2020/0139814 A1 * | 5/2020 | Galan Garcia | B32B 5/022 |
| 2021/0054691 A1 | 2/2021 | Ramirez | |
| 2021/0070174 A1 | 3/2021 | Marutani | |

(Continued)

OTHER PUBLICATIONS

Arceneaux, Ph.D., Jo Ann, Cytec Smart, Functional, & Protective: The Future of Coatings' Technology, Cytec Industries, Inc. (Smyrna, GA), Feb. 2013, 33 pages.

*Primary Examiner* — Christopher E Leiby
(74) *Attorney, Agent, or Firm* — C. Tumey Law Group PLLC

(57) ABSTRACT

A system may include at least one temperature control coil secured to a body of a vehicle in a position proximate a smart display sheet. The temperature control coil is configured to heat and/or cool the smart display sheet to maintain a temperature of the smart display sheet within an operating temperature range. Further, the system may include a control system configured to output instructions to control the temperature control coil.

15 Claims, 17 Drawing Sheets

(56) References Cited

U.S. PATENT DOCUMENTS

| | | |
|---|---|---|
| 2021/0146851 A1 | 5/2021 | Su |
| 2021/0241713 A1* | 8/2021 | Vaarlid |
| 2021/0253037 A1* | 8/2021 | Maddali ................ B60R 21/055 |
| 2022/0066258 A1* | 3/2022 | Cho .................... G02F 1/13338 |
| 2022/0111731 A1 | 4/2022 | Zhao |

* cited by examiner

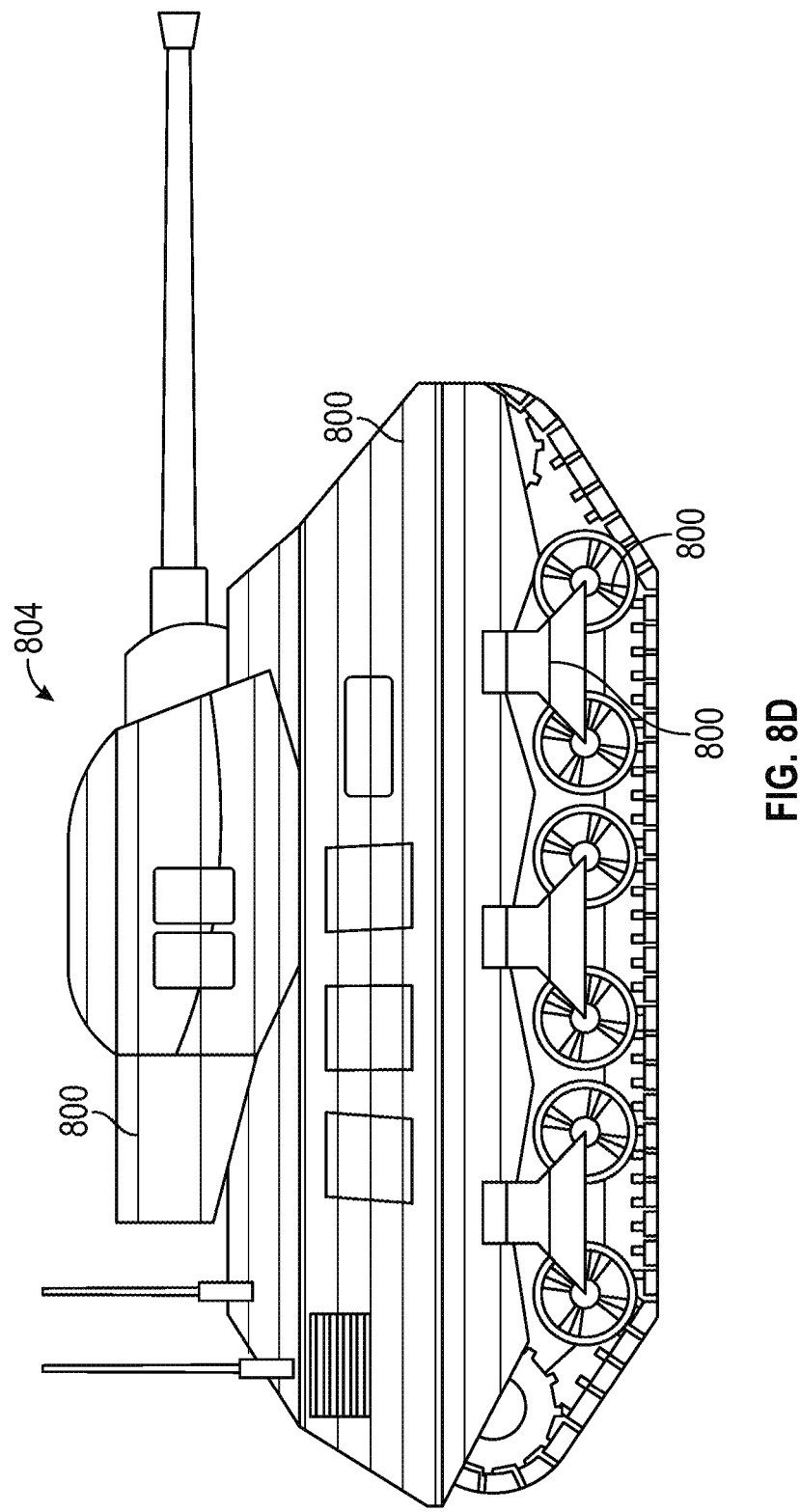

SMART DISPLAY SHEETS

CROSS-REFERENCE TO RELATED APPLICATIONS

The present application is a continuation-in-part of U.S. patent application Ser. No. 17/824,715, filed May 25, 2022, the entire disclosure of which is incorporated herein by reference.

BACKGROUND

An exterior appearance of a vehicle is usually chosen by the vehicle's owner to suit the owner's taste or a particular utility. A major part of how a vehicle appears on the exterior depends on the exterior paint job on the vehicle. In most cases, an exterior paint color of a vehicle (e.g., a car) is often chosen to represent a taste and/or personality of the vehicle's owner. In some cases, a vehicle is painted with text, patterns, pictures and other designs to suit a particular utility. For example, a company vehicle may be painted with a logo of the company to represent that the vehicle belongs to the company. A vehicle may be painted with advertising to promote a product or service.

The paint job on a vehicle is permanent and cannot be changed or modified without undertaking expensive repainting. In addition, repainting a vehicle is tedious, time consuming and typically requires the repainting job to be performed by skilled labor. For example, when an owner of a car wishes to change the exterior color of the car, the best option usually is to take the car to a professional paint shop to undergo time consuming and expensive repainting. One relatively cheaper and less time-consuming method to change the external appearance of a vehicle is vinyl wrapping which typically involves covering a vehicle's original paint with a vinyl film. Vinyl films come in different designs and colors. Colored vinyl wrapping involves placing an opaque vinyl film of a desired color on the body of the vehicle to personalize the color of the vehicle. Vinyl wraps are often used for advertising. For example, a vehicle can be wrapped with a custom-made advertising vinyl film having a company's logo, name and contact details. While vinyl wrapping is a relatively cheaper option for changing the visual appearance of a vehicle than re-painting the vehicle, vinyl wrapping is less durable and prone to damage from environment elements. Moreover, while vinyl wrapping is relatively easier to install on a vehicle as compared to repainting the vehicle, vinyl wrapping still is a semi-permanent solution and requires skilled labor for installing the wrapping.

Presently, no mechanism exists to change the visual appearance of a vehicle quickly and inexpensively.

BRIEF DESCRIPTION OF THE DRAWINGS

These drawings illustrate certain aspects of some of the embodiments of the present disclosure and should not be used to limit or define the method.

FIGS. 8A-8E illustrate a perspective views of temperature control coils secured to various vehicles for heating and/or cooling a vehicle and/or a smart display sheet secured to the vehicle, in accordance with embodiments of the present disclosure.

DETAILED DESCRIPTION

Figure 1B:
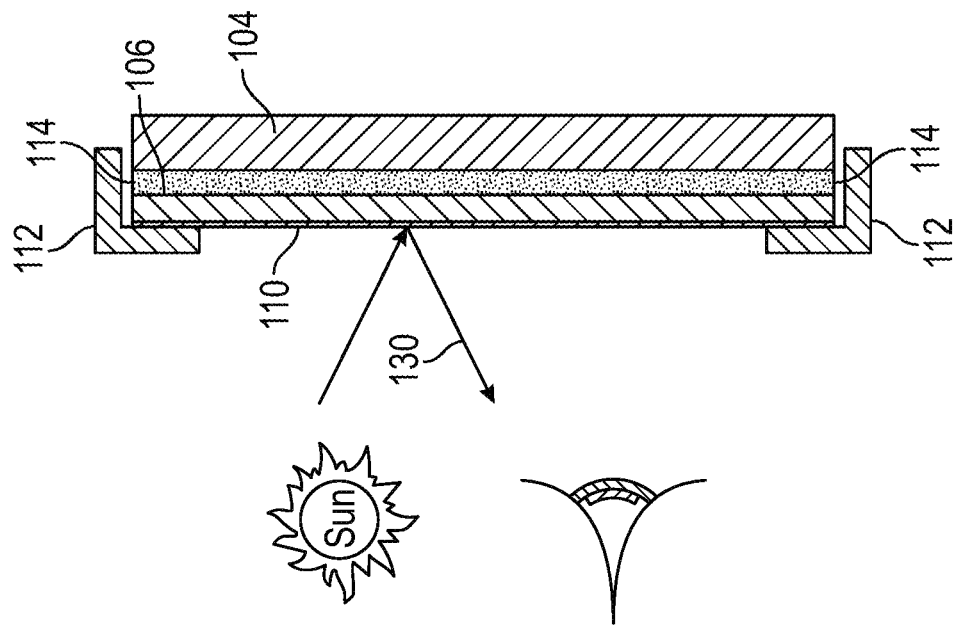
FIG. 1B illustrates a schematic diagram of an example smart display sheet of FIG. 1 without a separate substrate layer, in accordance with one or more embodiments of the present disclosure.

Embodiments of the present disclosure provide apparatuses and methods for changing an external visual appearance of a vehicle quickly and inexpensively. Smart Display Sheet is a new and innovative technology that offers vehicle users instantaneous access to limitless options and combinations of colors, shapes, writings, lighting and customize designs. The technology allows for a vehicle user to express personality, life events, moods and opinions through tailored designs. The user can outfit the vehicle like changes in one's clothing, the ability to change immediate appearances, as often as it likes. As described in accordance with embodiments of the present disclosure, a smart display sheet may be adhered to or integrally formed into at least a portion of an externally visible component of a vehicle such as an outer body or wheels of the vehicle. The smart display sheet innovation can use pixel-based resolution display sheet images and/or path-line-based display sheet images. In the case of pixel base, the images are produced by pixels or tiny dots containing unique color and tonal information that come together to create the image on the vehicle's smart sheet. The quality of the pixel-based images is resolution dependent. The number of pixels that make up an image as well as how many of those pixels are displayed per inch, both determine the quality of a smart sheet display image on the vehicle. The more pixels in image and the higher the resolution of the smart sheet will create the higher quality of the display image will be. In the case of path-line smart display sheet, the technology will utilize line art, instead of trying to keep track of the millions of pixels in an image. This methodology keeps track of points and the equations for the lines that connect them. Generally, these images are made up of paths or line art that can be infinitely scalable because they work based on algorithms rather than pixels. Pixel and line art can be used independently or together on the same smart sheet display image of the vehicle. The smart display sheet is capable of displaying a wide variety of graphics including, but not limited to, solid colors, patterns, designs, text and lights. A user of the vehicle may control what image or images are displayed on the smart display sheet by using one of several methods described in embodiments of this disclosure. For example, the smart display sheet may be communicatively coupled to an infotainment system of the vehicle. A software application running on the infotainment system may provide a user interface on a console display that allows the user to select and/or generate images for displaying on the smart display sheet. Images selected or generated by the user may be displayed on the smart display sheet, thus changing the visual appearance of the vehicle as desired by the user substantially instantly. A vehicle in accordance with embodiments of the present disclosure may include a passenger car, a truck, a bus, an airplane, a boat, a ship or any means for transporting persons or goods.

The smart display sheets are capable of displaying variety of display resolutions that can range from low to high quality images including (e.g., High Definition (HD), Ultra High Definition (UHD), 4K resolution, 8K resolution, 16K resolution, and other future developed resolution technologies) that can imitate a high-quality paint job on a vehicle. For example, in one embodiment, when the entire outer body of a car is covered by one or more smart display sheets, a solid color displayed by the one or more smart display sheets may imitate the look and shine of a high-quality paint job such that it is indistinguishable from a similar car painted in the same color.

As described in accordance with embodiments of the present disclosure, a user of a vehicle may be provided with an almost endless selection of images including thousands of colors, designs, patterns, shapes, pictures, text, lighting effects and combinations thereof that the user can choose from for displaying on a smart display sheet of a vehicle installed, for example, on an outer body component or wheel of the vehicle. The user may also be provided with tools to generate customized images by using selected images and/or generating custom designs for displaying on a smart display sheet. This allows the user to change the appearance of a vehicle substantially instantly at the touch of a button and as often as the user desires, for example, to express the user's personality, opinions, and life events.

Figure 1A:
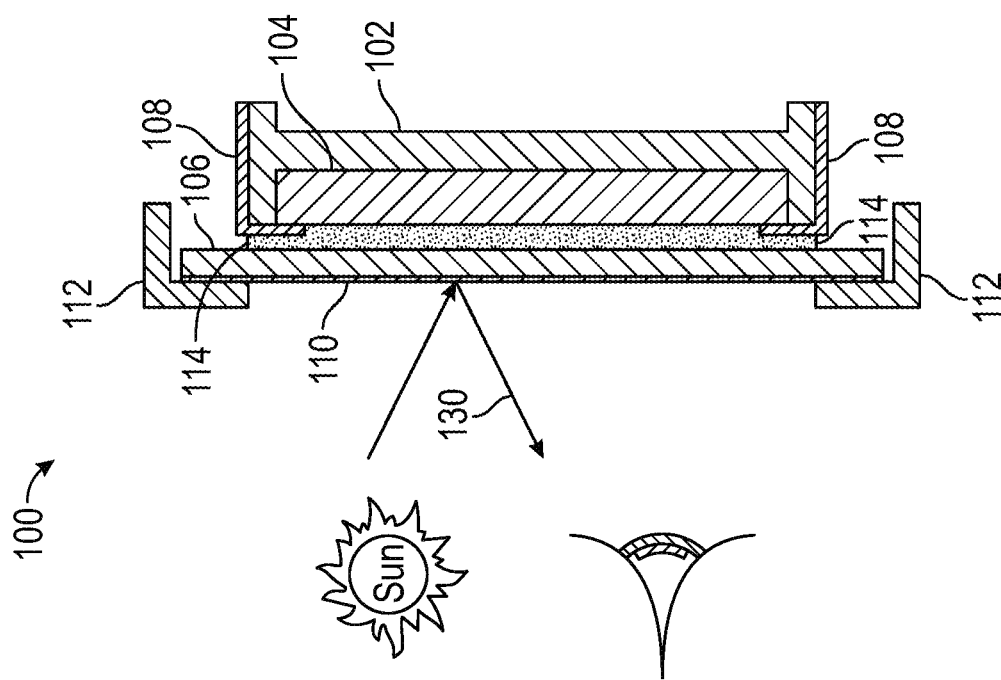
FIG. 1A illustrates a schematic diagram of an example smart display sheet, in accordance with one or more embodiments of the present disclosure.

FIG. 1A illustrates a schematic diagram of an example smart display sheet 100, in accordance with one or more embodiments of the present disclosure.

As shown in FIG. 1A, smart display sheet 100 includes a base substrate layer 102 and an electronic display panel 104 positioned on the substrate layer 102. The display panel 104 is capable of electrically displaying at least one image including, but not limited to, solid colors, patterns, designs, text and lighting. The display panel 104 may include one or more layers depending on the display technology used by the display panel 104 for displaying images. A display technology used by the display panel 104 may include, but is not limited to a Liquid Crystal Display (LCD), a backlit LCD, a plasma display, a Light Emitting Diode (LED) display, an Organic LED (OLED) display, High Definition (HD) display, Ultra High Definition (UHD) display, Full High Resolution (FHD), Quad High Resolution (QHD), 4K resolution display, 8K resolution display, 16K resolution display, Quantum UHD (QUHD), and a Quantum LED (QLED) display and combinations thereof. as well as future developed high resolution technologies. It may be noted that the display panel 104 may use any present technology, future technology and combinations thereof to display images. For example, the display panel 104 may use the best display technology available at any time to achieve the highest possible image quality. In one embodiment, depending on the display technology used for displaying images, display panel 104 may include one or more layers including, but not limited to, one or more glass layers, one or more dielectric layers, one or more display electrode layers, one or more protective layers, one or more plasma cell layers, one or more polarizing filter layers, one or more liquid crystal layers, one or more backlighting layers, one or more color filter layers one or more coating layers and one or more capacitive layers. The substrate layer 102 may be made of any insulating material including, but not limited to, glass, porcelain, mica, plastics, some metal oxides or combinations thereof.

In one embodiment, the substrate layer 102 and the display panel 104 are held together by a thin solid or transparent frame 108. In an alternative or additional embodiment, the substrate layer 102 and the display panel 104 are held together by an adhesive layer (not shown) sandwiched between the substrate layer 102 and the display panel 104. In one embodiment, the adhesive layer that holds together the substrate layer 102 and the display panel 104 is a transparent adhesive layer.

In certain optional embodiments, smart display sheet 100 may include a transparent cover layer 106 disposed on top of the display panel 104. The cover layer 106 may be made of any transparent material that is flexible or can be molded into different shapes and sizes. For example, the cover layer 106 may be made of glass or transparent plastic. In certain embodiments, the cover layer 106 is designed to reduce reflections 130 (e.g., from the sun or other light sources) so that images displayed by the display panel 104 are clearly visible to onlookers. For example, the cover layer 106 may be made of glass having anti-reflective property and/or having an anti-reflective coating installed thereon that reduces reflections and improves quality of images displayed by the display panel 104. In certain embodiments, the cover layer 106 is adhered to the display panel 104 using a transparent adhesive layer 114.

In one or more embodiments, smart display sheet 100 includes a protective layer 110 disposed over the display panel 104 or the optional cover layer 106 (whichever the case may be) that can protect the smart display sheet 100 from environmental elements including, but not limited to, heat, cold, wind, ultraviolet rays, water, dust, snow, hail and stones. Protective layer 110 may include at least one coating of one or more materials including, but not limited to, a polytetrafluoroethylene (PTFE) coating, a Parylene coating, an Acrylic coating, a Silicone coating, a Polyurethane coating, an Epoxy Resin coating, and other future developed suitable coatings.

In one or more embodiments, smart display sheet 100 may not include the substrate layer 102 or the substrate layer 102 may be integrated into the display panel 104. FIG. 1B illustrates a schematic diagram of an example smart display sheet 100 of FIG. 1 without a separate substrate layer 102, in accordance with one or more embodiments of the present disclosure.

As shown in FIG. 1B, smart display sheet 100 does not include a separate substrate layer 102. As noted above, the substrate layer 102 may be integrated as part of the display panel 104, for example, as a base layer. In this case, there is no need for the frame 108 or an adhesive which would otherwise be needed to hold together the display panel 104 and the substrate layer 102.

In one or more embodiments, smart display sheet 100 may include one or more solar devices 120 (e.g., transparent solar sheets, solar lines etc.) that can trap solar energy of the sun and produce electrical power. The electrical power captured by the solar devices may be used to power, at least in part, the smart display sheet 100 and/or systems associated with the smart display sheet 100.

Figure 1D:
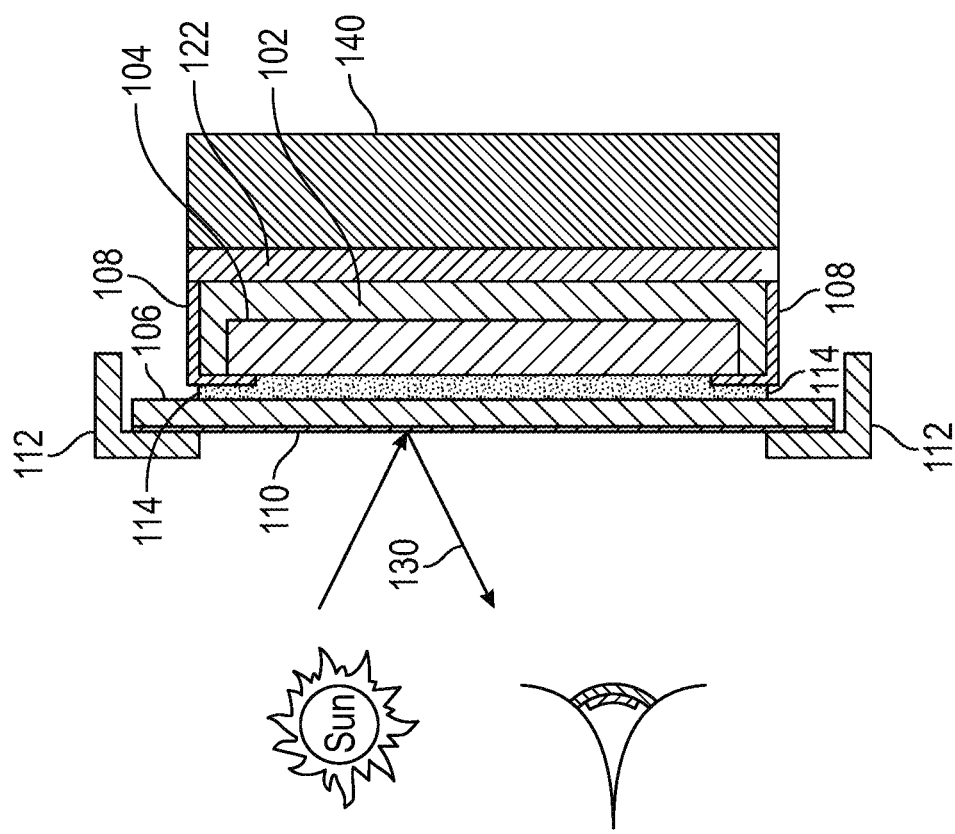
FIG. 1D illustrates an adhesive or magnetic layer that attaches the smart display sheet of FIG. 1 to a component of a vehicle, in accordance with embodiments of the present disclosure
Figure 1C:
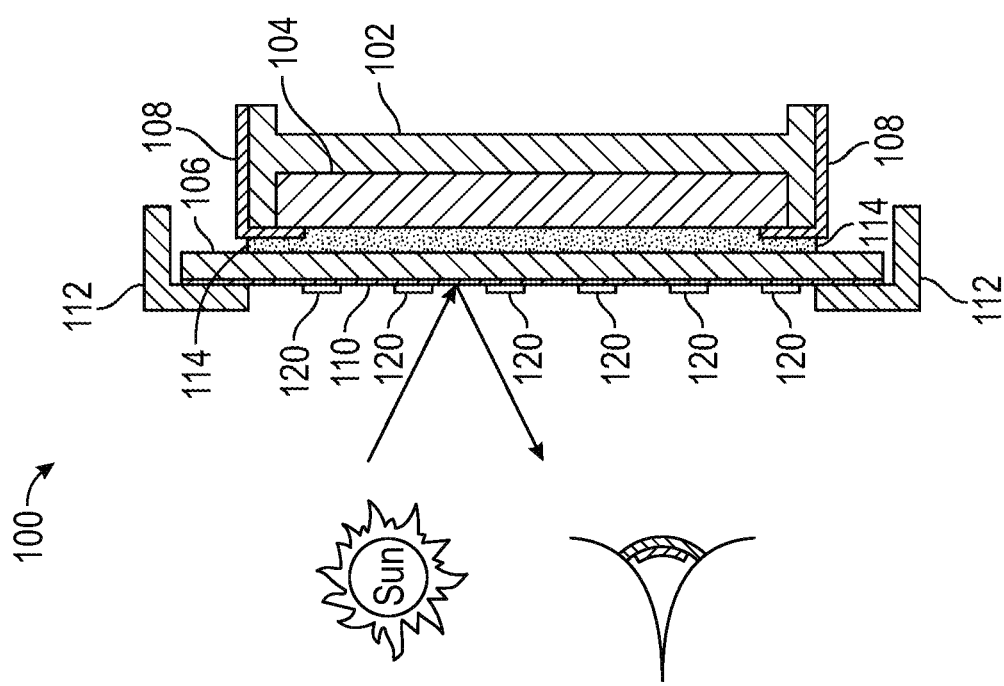
FIG. 1C illustrates a schematic diagram of an example smart display sheet of FIG. 1 with one or more solar devices, in accordance with one or more embodiments of the present disclosure.

FIG. 1C illustrates a schematic diagram of an example smart display sheet 100 of FIG. 1 with one or more solar devices, in accordance with one or more embodiments of the present disclosure.

In one embodiment, the solar devices 120 are transparent or at least partially transparent, thus offering minimal obstruction to the view of the images displayed by the smart display sheet 100. Additional electrical power generated by the solar devices 120 may help reduce the power burden on the electrical circuit of the vehicle from which the smart display sheet 100 draws power for its functioning. The solar devices 120 may be adhered to or integrally formed into the outermost layer of the smart display sheet 100 such as the display panel 104, cover layer 106 or protective layer 110, whichever the case may be. In one embodiment, the solar devices 120 may be integrated on a transparent solar sheet (not shown) that is adhered using a transparent glue to the topmost layer of the smart display sheet 100. The solar devices can be applied to the entire vehicle or only in part to certain outer body parts exposed to capture maximum sunlight. Any excess energy captured from the solar system may be used to charge the battery in the case of Electric Vehicles.

In one or more embodiments, one or more layers of the smart display sheet 100 including the substrate layer 102, display panel 104, optional cover layer 106 and protective layer 110 are not attached to the adjacent layers or held in position by other means. For example, the substrate layer 102 may not be adhered to the display panel 104 using an adhesive layer or the substrate layer 102 and the display panel 104 are held together by a frame 108. Similarly, the cover layer 106 may not be adhered to the display panel 104 using the transparent adhesive layer 114. In such cases, an outer frame 112 may be used to hold together in position all layers of the smart display sheet 100.

In one or more embodiments, the smart display sheet 100 is moldable and/or flexible and can be take any desired shape. This means that all layers of the smart display sheet 100 described above including the substrate layer 102, the display panel 104, frame 108, cover layer 106 and protective layer 110 are moldable and/or flexible and can be take any desired shape. The ability of the smart display sheet 100 to be moldable and/or flexible and assume any shape allows the smart display sheet 100 to be installed flush with the contours of a vehicle component (e.g., body of the vehicle). In one or more alternative embodiments, one or more layers of the smart display sheet 100 may not be flexible but can be custom built to match the contours of the vehicle component over which they are installed. For example, the cover layer 106 may be made of inflexible glass but can be molded into the shape of the surface of the vehicle over which the smart display sheet 100 is to be installed.

In one or more embodiments, the smart display sheet 100 may be adhered to a component (e.g., outer body, wheel etc.) of a vehicle using an adhesive. For example, FIG. 1D illustrates an adhesive layer 122 that attaches the smart display sheet 100 to a component 140 of a vehicle, in accordance with embodiments of the present disclosure. Vehicle component 140 may include but is not limited to an outer body of the vehicle, a wheel of the vehicle, and a removable part of the vehicle such as a removable convertible top and a removable rear spoiler. One or more of several types of known adhesives may be used for the adhesive layer 122 for adhering the smart display sheet 100 to the component 140 of a vehicle. Exemplary adhesives include, but are not limited to the adhesive layer comprises a Cyanoacrylate adhesive, a polyurethane adhesive, an acrylic-based adhesive, an epoxy-based adhesive, a urethane-based adhesive, a structural adhesive, tapes, films, threadlockers, flex glues, vehicle superglues, vehicle trim adhesives, plastic bonder adhesives, gap fillers, liquid gaskets or combinations thereof. As those of ordinary skill in the art will appreciate, combinations of two or more adhesives may be used for the adhesive layer 122.

In one or more embodiments, the smart display sheet 100 may be attached to a component (e.g., outer body panel, wheel etc.) of a vehicle using one or more magnets. For example, a magnetic layer may be affixed using an adhesive to the innermost layer of the smart display sheet 100 (e.g., the substrate layer or the display panel whichever the case may be), wherein the magnetic layer allows the smart display sheet 100 to be attached to a metal body component of a vehicle. Using magnets to attach the smart display sheet 100 to a vehicle component allows the smart display sheet 100 to be easily removable off the component which can simplify servicing or replacement of the smart display sheets 100.

In one or more alternative embodiments, smart display sheet 100 can be integrally formed into a component of a vehicle. For example, a smart display sheet 100 may be manufactured as an outermost layer of a vehicle component such as a vehicle exterior body component or a wheel.

Figure 2:
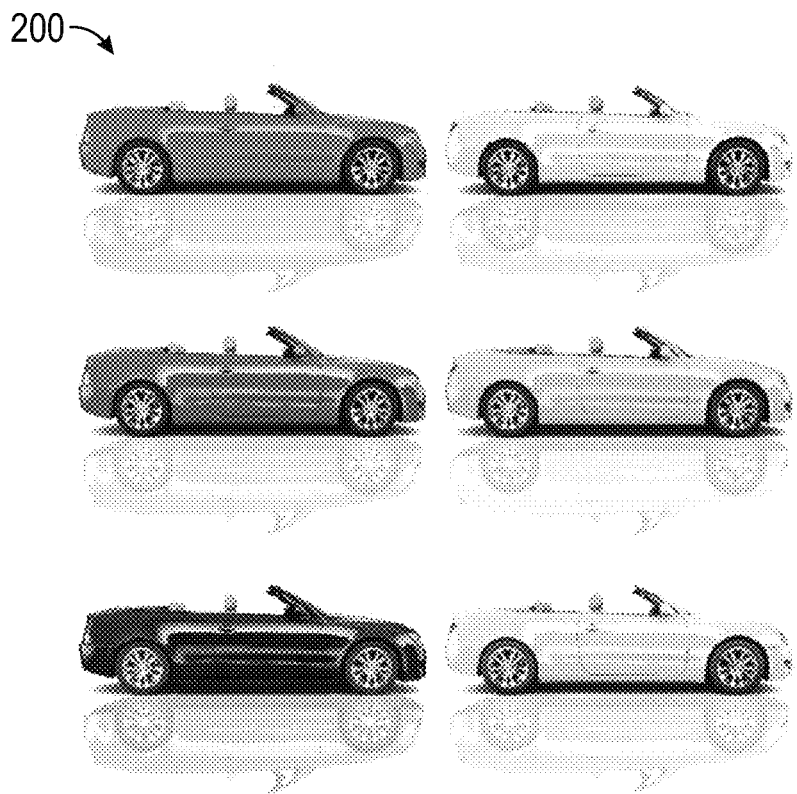
FIG. 2 is an example illustration of a smart display sheet of a car displaying different colors, in accordance with embodiments of the present disclosure

FIG. 2 is an example illustration 200 of a smart display sheet of a car displaying different colors, in accordance with embodiments of the present disclosure. FIG. 2 shows six views of the same car displaying six different colors. In this context, a smart display sheet 100 may cover the entire outer body of the car so that a solid color may be displayed over the entire outer body of the car. This allows the outer body color of the car to be changed to a desired color substantially instantly with limitless color options to select from.

Figure 3:
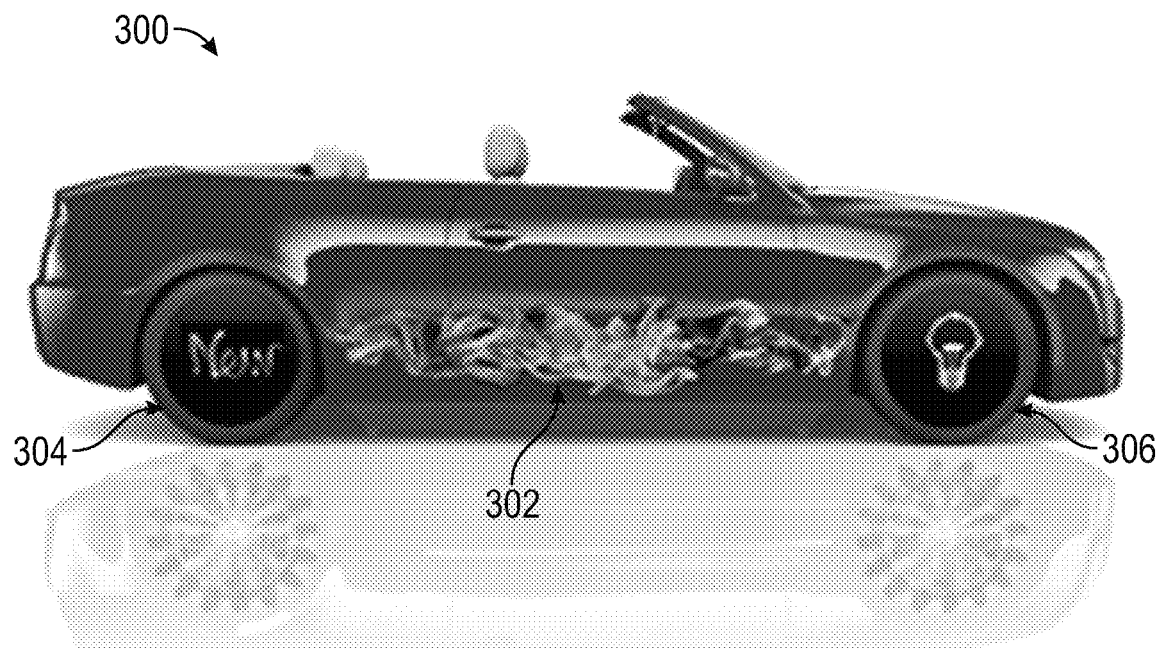
FIG. 3 is an example illustration of a car displaying a combination of images on several smart display sheets, in accordance with embodiments of the present disclosure

FIG. 3 is an example illustration 300 of a car displaying a combination of images on several smart display sheets, in accordance with embodiments of the present disclosure. As shown in FIG. 2, a colored pattern 302 is displayed on an outer body portion of the car. In addition, images 304 and 306 are displayed on the wheels of the car. In one embodiment, a smart display sheet 100 may only cover a portion of a vehicle component. For example, to display the pattern 303, a smart display sheet 100 may cover the portion of the outer body of the car between the two wheels. Further, to display the images 304 and 306 on the respective wheels, a smart display sheet 100 may be in the form of a circular disc covering each wheel of the car. In some embodiments, the wheel of the car may include runflat inserts to allow to provide, for example, extended mobility with different geographical landscapes to protect the tire while allowing severe road conditions.

Figure 4:
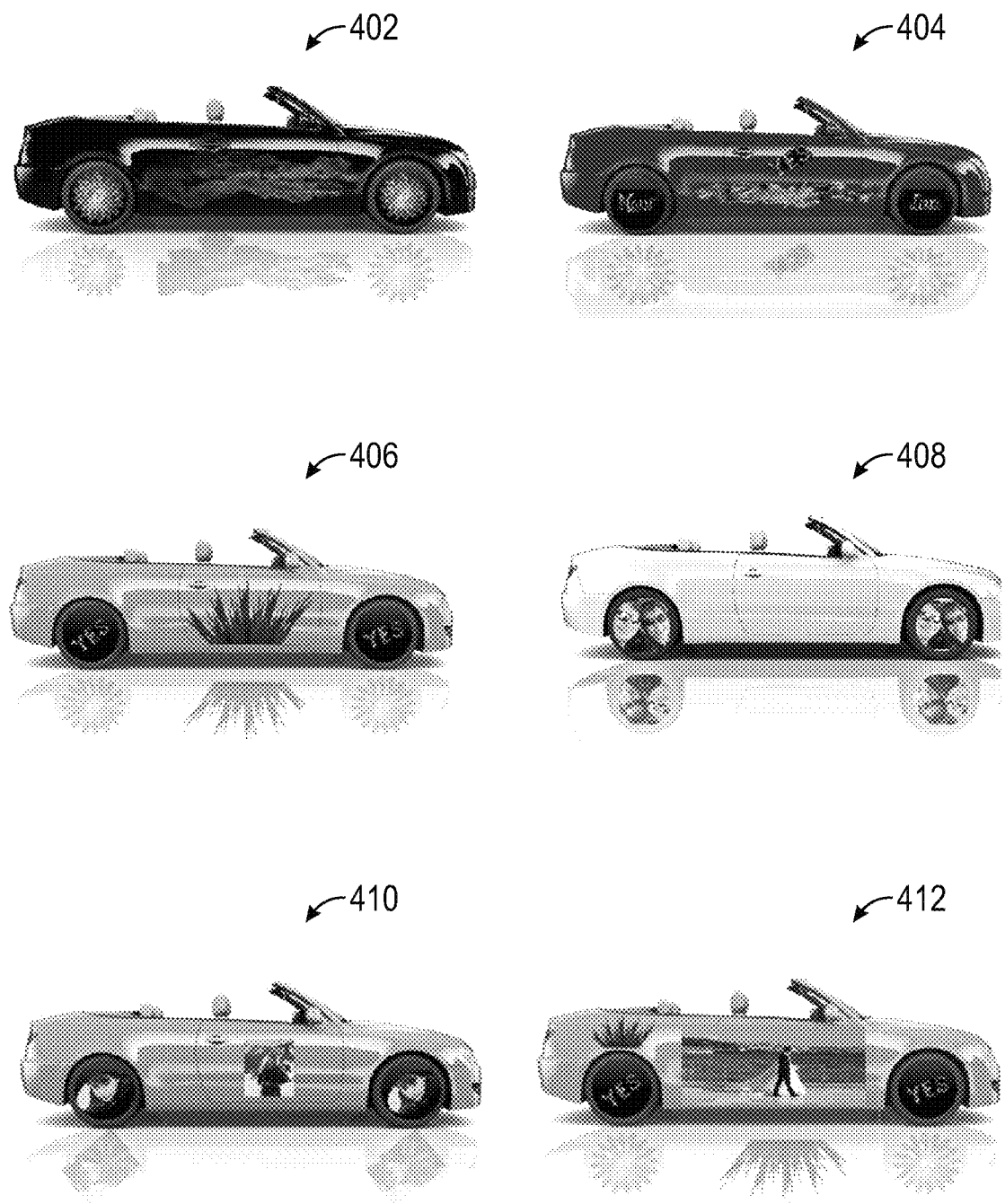
FIG. 4 illustrates example views of a car displaying a plurality of images on smart sheets, in accordance with embodiments of the present disclosure

FIG. 4 illustrates example views of a car displaying a plurality of images on smart sheets, in accordance with embodiments of the present disclosure. FIG. 4 shows six views of the same car displaying six different combinations of images on one or more smart display sheets 100. View 402 shows patterns being displayed on the body and wheels of the car. View 404 and 406 show different patterns displayed on the body of the car and different textual designs displayed on the wheels of the car. View 408 and 410 show pictures being displayed on the body and wheels of the car. View 412 shows a picture and a pattern being displayed on the body of the car and textual designs displayed on the wheels of the car. It may be noted that the base color of the car in each view may also be an image of a solid color. In this case, other images (e.g., patterns, textual designs, pictures etc.) are superimposed on the solid color image.

Figure 5:
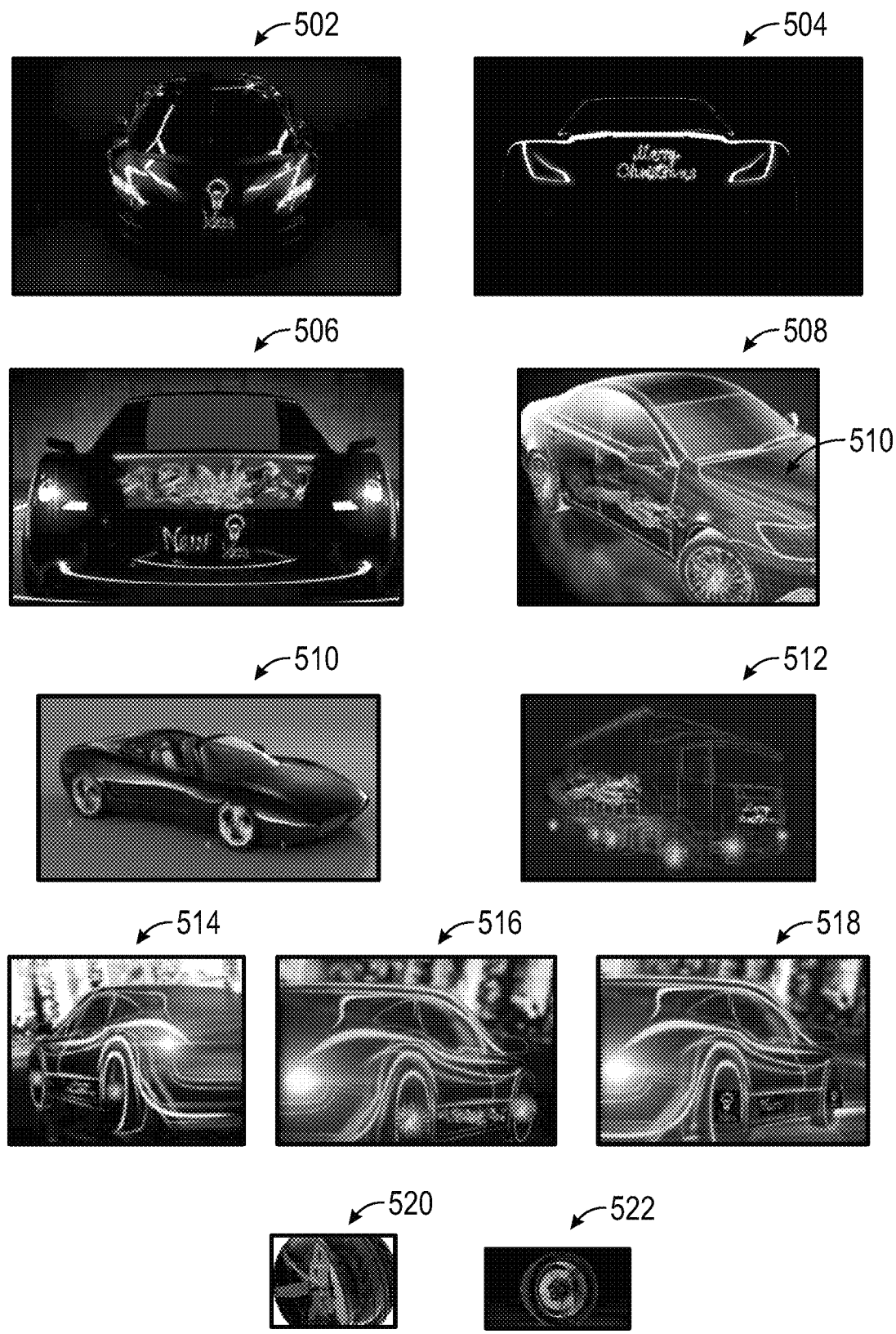
FIG. 5 illustrates example views of displaying a plurality of images on smart sheets, in accordance with embodiments of the present disclosure

FIG. 5 illustrates example views of displaying a plurality of images on smart sheets, in accordance with embodiments of the present disclosure. FIG. 5 shows views of different vehicles displaying different combinations of images on one or more smart display sheets 100. View 502 shows an artistic pattern being displayed on the hood of a car. View 504 shows a holiday message being displayed on the hood of a car. View 506 shows a combination of a colorful pattern, a textual design and an artistic image being displayed on the hood of a car. View 508 shows colorful patterns being displayed on the body and wheels of a car. View 508 additionally shows a grid 510 of solar lines being displayed over the entire outer body of the car. View 510 shows colorful patterns being displayed on the wheels of the car. View 512 shows colorful patterns being displayed on the body and wheels of a truck and a holiday message being displayed in the front of the truck. Views 514, 516 and 518 show three different views of a car displaying lighting effects on the body of the car in combination with colorful patterns, textual designs, artistic images and messages. Views 520 and 522 show close up images of a wheel displaying several colors. It may be noted that in view 520, the colors are being displayed on the spokes of the wheel. This may be implemented by disposing several smart display sheets to cover the spokes only of the wheel and not the entire wheel.

It may be appreciated from FIGS. 2-5 that an outer visual appearance of a vehicle may be dramatically changed at will substantially instantly by displaying a combination of images on one or more smart display sheets 100 adhered to or integrally formed into components of the vehicle or portions thereof.

Images may be displayed using several methods on a smart display sheet 100 adhered to a vehicle component 140 or integrally formed into a vehicle component 140. In one embodiment, the smart display sheet 100 may be communicatively coupled to a control console of a vehicle, wherein a user of the vehicle (e.g., owner of the vehicle 602 or another authorized user of the vehicle 602) may use the control console to select or generate one or more images for display on one or more smart display sheets disposed on a vehicle component 140.

Figure 6:
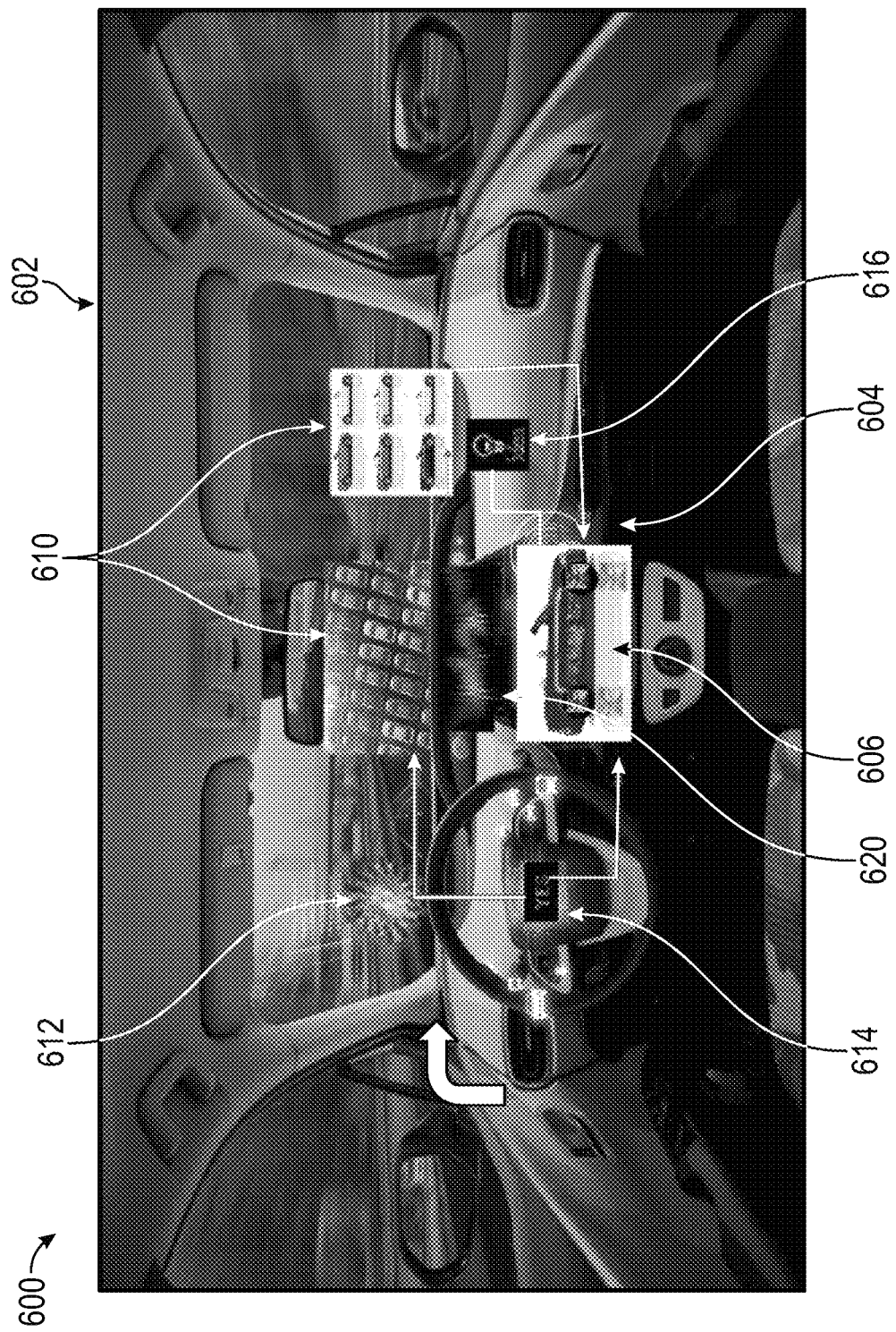
FIG. 6 illustrates an example system for selecting and/or generating images for displaying on one or more smart display sheets disposed on a vehicle component, in accordance with embodiments of the present disclosure

FIG. 6 illustrates an example system 600 for selecting and/or generating images for displaying on one or more smart display sheets 100 disposed on a vehicle component 140, in accordance with embodiments of the present disclosure. As shown in FIG. 6 a vehicle 602 (e.g., a passenger car) includes a control console 604 as part of an infotainment system of the vehicle 602. The control console 604 may be communicatively coupled to one or more smart display sheets 100 adhered to or integrally formed into a component 140 of the vehicle 602. The control console 604 may be implemented by a computing device running one or more software applications. The computing device may include at least one processor and one or more memory devices, wherein the one or more memory devices may store software code/instructions which when executed by the processor implement functionality the control console 604 has been configured to perform. The one or more memory devices may additionally store data related to selecting and/or generating images, the data including, but not limited to, color palette, pictures, patterns, light effects, designs and alphanumeric characters. Control console 604 may be configured to allow a user to select and/or generate one or more images for display by one or more smart display sheets 100 of the vehicle 602. Control console 604 may provide a user interface that is operable by the user for selecting and/or generating images. As shown in FIG. 6, control console 604 may include a console display 606 which displays a graphical user interface the user can interact with. Control console 604 may provide several input and output methods as part of the user interface to enable the user to interact with the control console 604. For example, console display 606 may be a touch sensitive display allowing the user to interact with a graphical user interface displayed on the console display 606 using touch input. Additionally, or alternatively, control console 604 may include one or more buttons, knobs, touch pads etc., for the user to interact with the graphical user interface displayed on the console display 606. The control console 604 may include one or more display devices as part of the user interface, wherein the display device includes but are not limited to console display 606, a digital instrument cluster display and a heads-up display of the vehicle 602.

Control console 604 may be configured to run one or more software applications that allow a user of the vehicle 602 to select and/or generate images. For example, control console 604 may present a selection of colors, patterns, designs, text, lighting effects, pictures etc., on the console display 606 that can be displayed as images on one or more smart display sheets 100 of the vehicle 602. The user can select any one or a combination of images for display on a smart display sheet 100. As shown in FIG. 6, in one example, the user is presented with several representations/views 610 of the user's vehicle in different colors. In this case, the outer body of the vehicle is entirely covered with a smart display sheet 100. The user may select any one representation/view 610 based on a color preference of the user to change the outer body color of the vehicle to the selected color. In an additional or alternative embodiment, the console display 606 may present a color panel 620 to the user from which the user can select one or more colors to be displayed on a smart display sheet 100. In another example, as shown in FIG. 6, the user may select a wheel pattern 612 from a plurality of wheel patterns presented to the user on the console display 606. In this case, a smart display sheet 100 may cover at least a portion of one or more wheels of the vehicle 602. For example, a smart display sheet 100 may be in the form of a circular disc covering a wheel of the vehicle 602. The selected wheel pattern 612 may be displayed on at least one smart display sheet 100 of a wheel to change the appearance of the wheel. Similarly, in other examples, the user may select text 614 and other images 616 from a selection of text (e.g., in different designs) and images respectively for display on portions of one or more smart display sheets 100 covering different components of the vehicle 602.

In one or more embodiments, the user may select a combination of one or more colors, one or more designs, one or more patterns, one or more text, one or more lighting effects, one or more pictures etc. for displaying on several portions of one or more smart display sheets 100 covering different components of the vehicle 602. The control console 604 may allow the user to select a portion of a smart display sheet 100 that is to display each selected image. For example, as shown in FIG. 6, the console display 606 may display a view of the user's vehicle 602 with all image selections made by the user and potential areas of one or more smart display sheets 100 on the vehicle 602 that can display images. This allows the user to review the selections, update one or more selections and/or make new selections. Once the user is happy with the image selections, the user may launch the selections (e.g., by pressing a button on the control console 604 or selecting an option on the console display 606) to display the selected images on the one or more smart display sheets 100.

In one or more embodiments, the control console 604 may be connected to a network such as the internet. The control console 604 may connect over the network to one or more servers or services that provide access to standard or custom images including but not limited to colors, pictures, patterns, light effects, designs and alphanumeric characters. This allows the user to download one or more images over the network from a server or service, for display on a smart display sheet 100.

In one or more embodiments, control console 604 may be configured to run a software application that allows the user to generate customized images for display on a smart display sheet 100 of the vehicle 602. For example, a software application running on the control console 604 may allow the user to write or draw on the console display 606 using a wireless stylus pen. Additionally, or alternatively, the user may select several images stored in a memory device of the control console 604 to build a custom image. In one embodiment, the control console 604 may allow the user to edit standard images stored in a memory device of the control console 604 to build a custom image. The custom images generated by the user may be displayed on a selected portion of a smart display sheet 100 of the vehicle 602.

Figure 7:
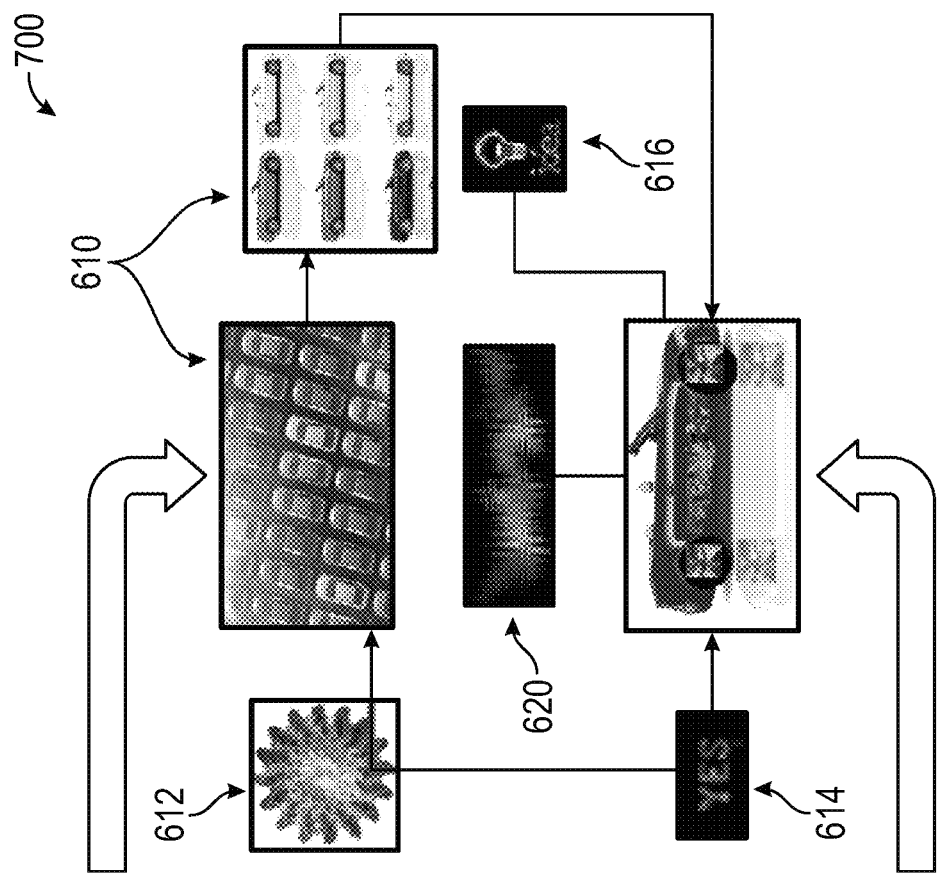
FIG. 7 illustrates an example system for selecting images and/or generating custom images for displaying on a smart display sheet, in accordance with embodiments of the present disclosure.
Figure 7:
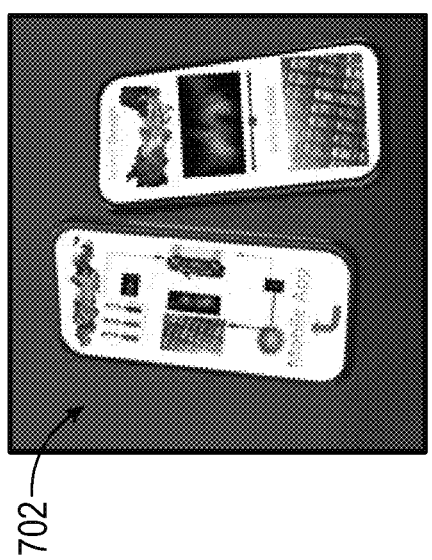
Figure 7:
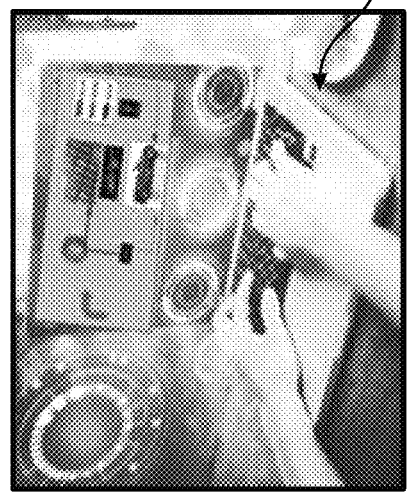

In one or more embodiments, the control console 604 may connect to a portable computing device (e.g., smartphone, tablet computer, laptop computer, etc.) using a wired or wireless connection. The portable computing device may run the same or similar software applications as are run by the control console 604 to allow the user to select images and/or generate custom images for displaying on one or more smart display sheets 100 of the vehicle 602. FIG. 7 illustrates an example system 700 for selecting images and/or generating custom images for displaying on a smart display sheet 100, in accordance with embodiments of the present disclosure. As shown in FIG. 7, a portable computing device such as a smartphone 702 and/or laptop computer 704 may be used to select images and/or generate images for displaying on a smart display sheet 100. The portable computing device may connect to the control console 604 of the vehicle 602 using a wireless communication protocol (e.g., Bluetooth, Wi-Fi, Near-Field communication (NFC) etc.) or a wired connection protocol (e.g., USB, Ethernet, lightning connector etc.). Each portable computing device may run software applications that allow a user (e.g., owner of the vehicle 602 or another authorized user of the vehicle 602) to select images and/or generate custom images for displaying on a smart display sheet 100 of the vehicle 602. The images may be stored in a local memory of the portable computing device or may be accessible to the portable computing device over a network (e.g., via the internet). In one embodiment, a portable computing device may access (e.g., wirelessly or over a wired connection) the images stored in a memory device of the control console 604 and select one or more images from the accessed images. The software applications run by the portable computing devices may be same as or similar to the software applications that may be run by the control console 604 as discussed with reference to FIG. 6. For example, a software application running on a portable computing device may present a graphical user interface that is similar to the graphical user interface presented by the control console 604 on the console display 606 of the vehicle 602. The methods of selecting images and generating custom images using a portable computing device are similar to the methods for selecting and generating images using the control console 604 as discussed in relation to FIG. 6 and will not be discussed again.

In one or more embodiments, a portable computing device or a non-portable computing device (e.g., a desktop computer) may remotely connect to the control console 604 of the vehicle 602 over the internet, and remotely send selected images and/or custom generated images to the control console 604 for displaying on a smart display sheet 100 of the vehicle 602.

It may be noted that FIG. 7 shows a smart phone 702 and laptop computer 704 as non-limiting examples of computing devices that can be used to select and/or generate images for displaying on a smart display sheet 100. A person having ordinary skill in the art can appreciate that any portable computing device capable of running software applications may be used to implement the methods discussed above.

In one or more embodiments, the smart display sheets 100 may piggyback off of the vehicle systems and use already existing vehicle components to run the smart display sheets 100. For example, a smart display sheet 100 may receive electrical power from an electrical power circuit of the vehicle that powers a plurality of electrical components of the vehicle. The control console 604 and the console display 606 discussed above with reference to FIG. 6 may be part of the infotainment system of the vehicle. For example, one or more processors and memory devices that are already built into the vehicle to support various vehicle systems may be used to implement the methods discussed above for selecting/generating and displaying images on the smart display sheets of the vehicle.

Figure 8A:
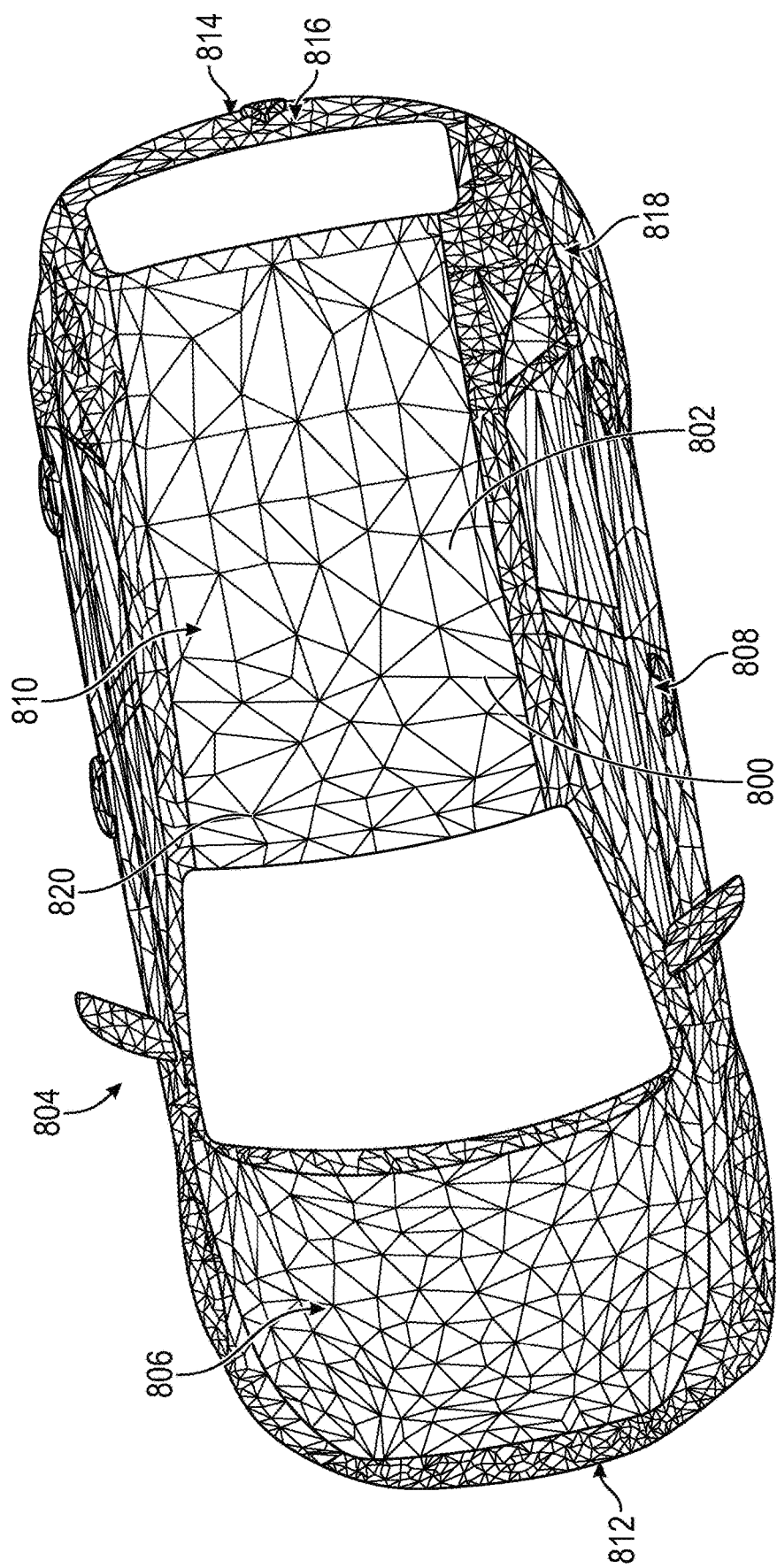

FIGS. 8A-8E illustrate a perspective views of temperature control coils secured to various vehicles for heating and/or cooling a vehicle and/or a smart display sheet secured to the vehicle, in accordance with embodiments of the present disclosure. Referring to FIG. 8A, at least one temperature control coil 800 may be secured to a body 802 of a vehicle 804. The vehicle 804 may include any suitable passenger vehicle for driving on roadways. For example, the vehicle 804 may be a car, truck, sports utility vehicle, etc. In the illustrated embodiment, the vehicle 904 is a car. Alternatively, as set forth below, the vehicle 804 may comprise a boat, train, airplane, military vehicles (e.g., tanks, submarines, etc.), or any other vehicle 804 having the smart display sheet 100 (shown in FIG. 9). In the illustrated embodiment, a plurality of temperature control coils 800 are secured to various areas of the vehicle 804. For example, the temperature control coils 800 may be secured to a hood 806, doors 808, a roof 810, a front bumper 812, a rear bumper 814, a trunk 816, side panels 818, etc. of the vehicle 804.

Moreover, the at least one temperature control coil 800 may include a heating coil 912 (shown in FIG. 9), a cooling coil 914 (shown in FIG. 9), or some combination thereof. The temperature control coil 800 is configured to heat and/or cool the smart display sheet 100 to maintain a temperature of the smart display sheet 100 within a predetermined operating temperature range. The operating temperature range may be between 32-95 degrees Fahrenheit. Alternatively, the operating range may be 40-90 degrees Fahrenheit, 60-85 degrees Fahrenheit, or any suitable operating temperature range for the smart display sheet 100. As set forth above, the smart display sheet 100 may include electronic components that may fail in response to extreme temperatures (e.g., temperatures outside of the operating temperature range). As such, the heating and/or cooling the smart display sheet 100 with the temperature control coil 800 may protect the smart display sheet 100 by reducing risk of premature failure.

For example, the temperature control coil 800 may include the heating coil 912 to provide heat to the smart display sheet 100 in snowy/icy conditions to maintain the temperature of the smart display sheet 100 above thirty-two degrees for an operating temperature range of 32-95 degrees Fahrenheit. Further, the temperature control coil 800 may include a cooling coil 914 to cool the smart display sheet 100 in summer conditions to maintain the temperature of the smart display sheet 100 below ninety-five degrees Fahrenheit for the operating temperature range of 32-95 degrees Fahrenheit. Further, the at least one temperature control coil 800 may include a heating coil 912 and a separate cooling coil 914. Alternatively, the at least one temperature control coil 800 may include a single coil for providing both heating and cooling to the smart display sheet 100.

Moreover, at least one temperature sensor 820 may be disposed on the vehicle 804. The at least one temperature sensor 820 is configured to output a temperature signal comprising a measured temperature at a location of the sensor on the vehicle 804. For example, the at least one temperature sensor 820 may be disposed proximate the front bumper 812 of the vehicle 804. As such, the at least one temperature sensor 820 may output a temperature signal comprising the measured temperature at the front bumper 812 of the vehicle 804. At least one control system 1216 (shown in FIG. 12) may be configured to receive the temperature signal and output the instructions to the at least one temperature control coil 800 based at least in part on the received temperature signal. For example, in response to receiving a temperature signal with a measure temperature of thirty-one degrees (i.e., for a operating temperature range of 32-95 degrees Fahrenheit), the at least one control system 1216 may be configured to output instructions to the at least one temperature control coil 800, or to a switch 1214 (shown in FIG. 12) controlling power to the temperature control coil 800, to activate and heat the smart display sheet 100.

Figure 8B:
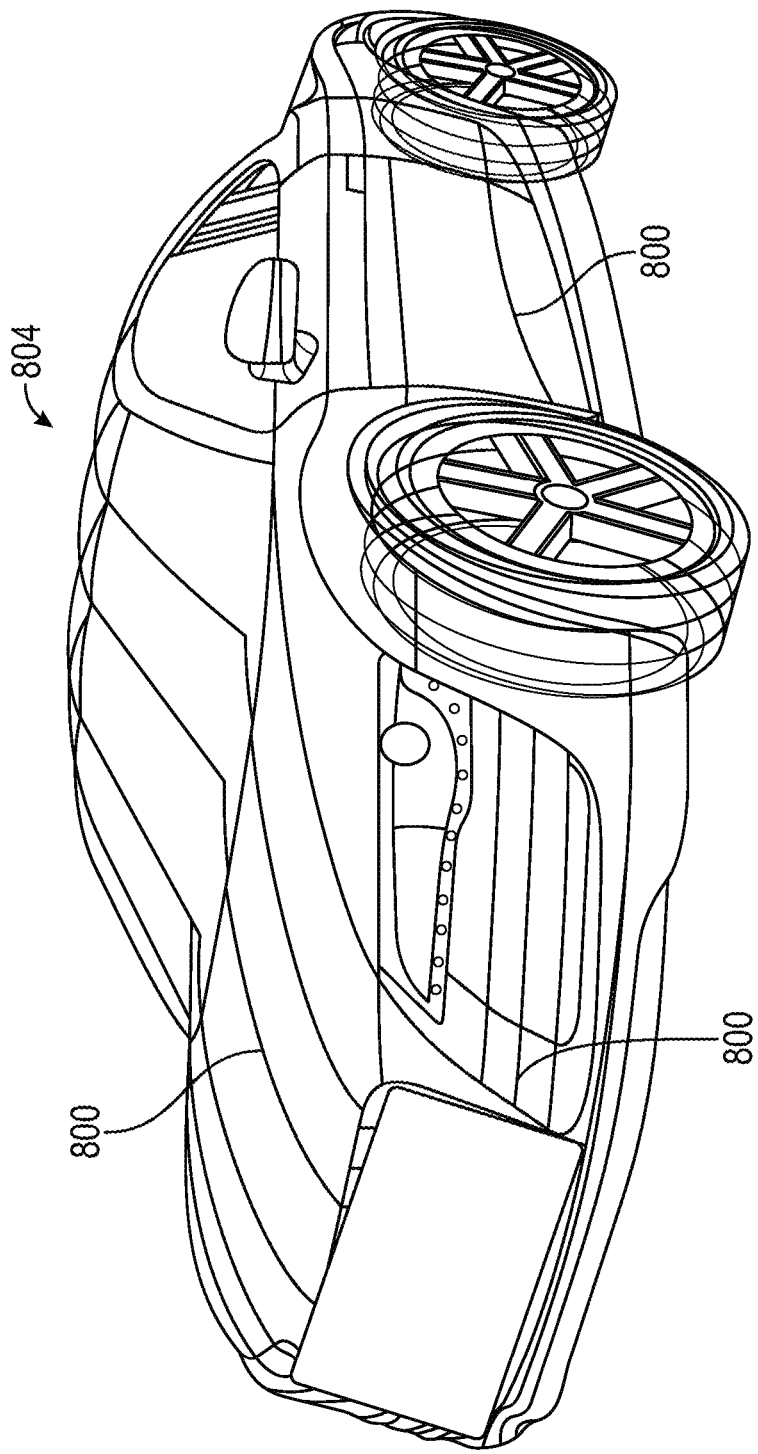

FIG. 8B discloses another embodiment of the temperature control coils 800 secured to the vehicle 804. As illustrated, the temperature control coils 800 may be disposed on individual heating paths. That is, the temperature control coils 800 may not be interconnected. Having temperature control coils 800 on individual heating paths may allow remaining temperature control coils 800 to continue to operate in response to failure of one of the temperature coils 800.

Figure 8C:
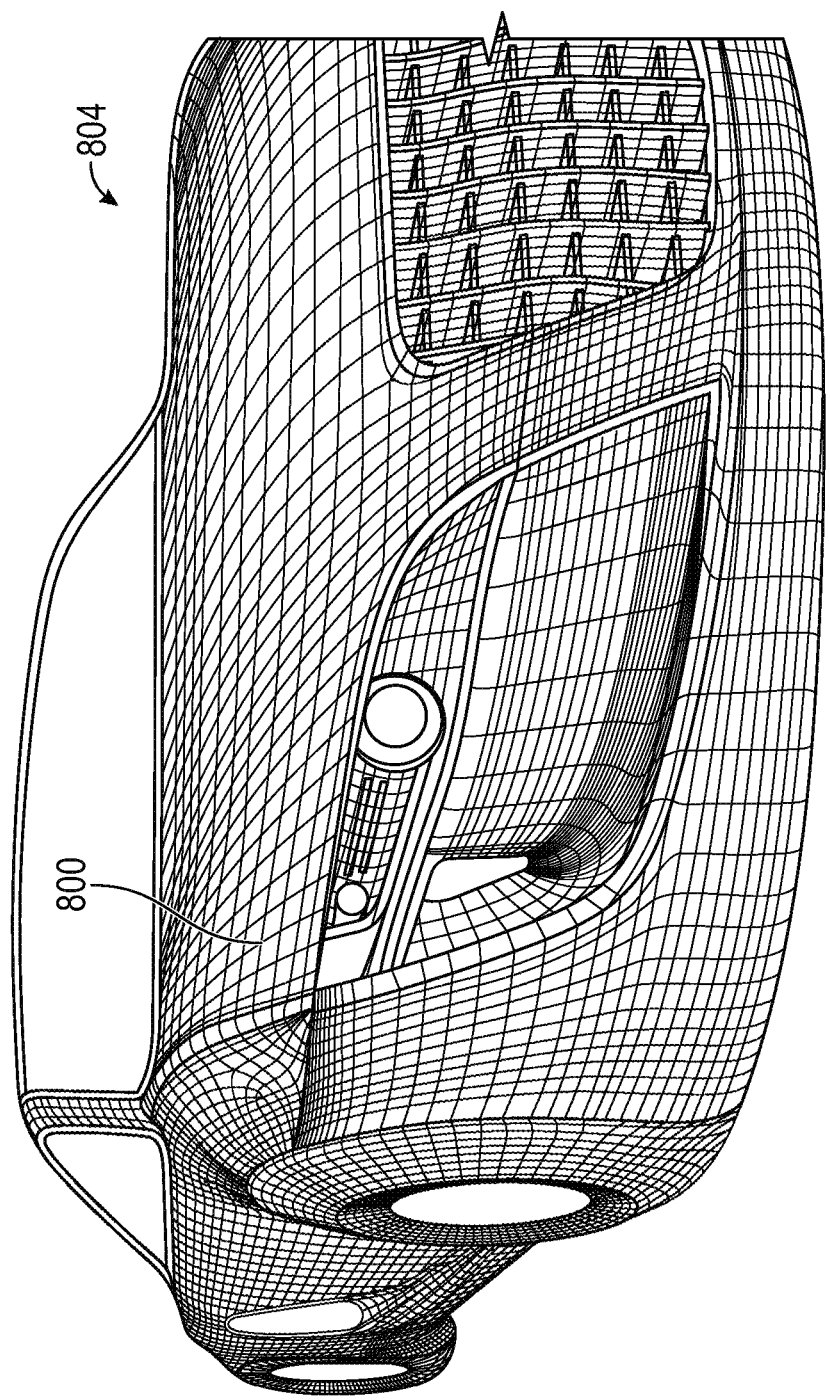

FIG. 8C discloses another embodiment of the temperature control coils 800 secured to the vehicle 804. As illustrated, the temperature control coils 800 may be arranged in an interconnected grid pattern on the vehicle 804. Having the temperature control coils 800 disposed in the grid pattern may provide for more comprehensive coverage of heating and/or cooling over the vehicle 804.

FIG. 8D discloses another embodiment of the temperature control coils 800 secured to the vehicle 804. As illustrated, the vehicle 804 may be a tank. During operation, the tank may traverse various climates and or terrain. Having the smart display sheet 100 secured to the tank may provide a degree of camouflage by displaying at least one image similar to the environment surrounding the tank. However, the temperature of the environment may be outside of the operating temperature range of the smart display sheet 100. Thus, as set forth above, the temperature control coil 800 may be configured to heat and/or cool the smart display sheet 100 to maintain a temperature of the smart display sheet 100 within the operating temperature range. Further, the temperature control coil 800 may be configured to heat and/or cool the body 802 of the tank to a desired temperature to reduce a risk of detection via thermal scans.

Figure 8E:
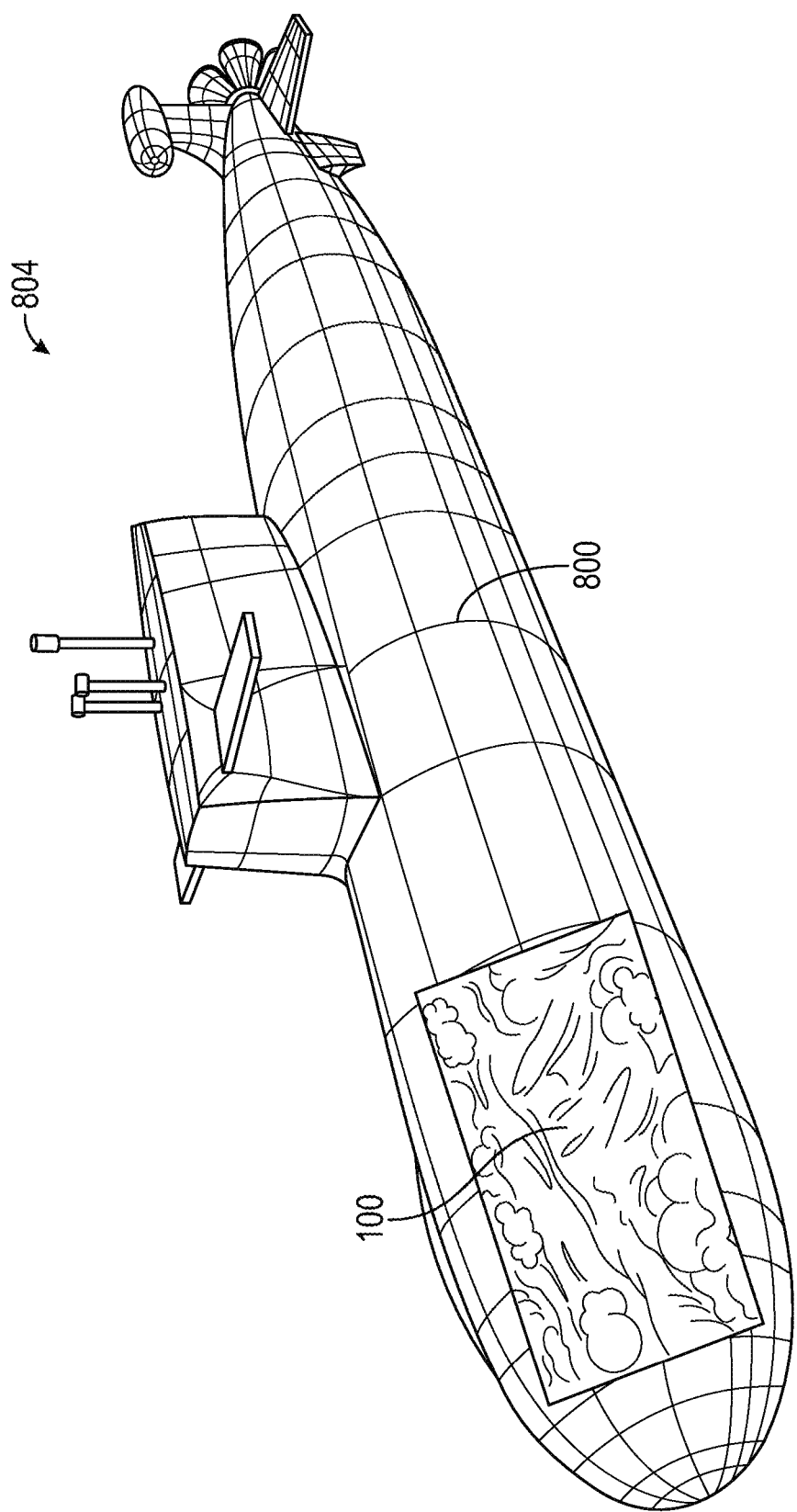

FIG. 8E discloses another embodiment of the temperature control coils 800 secured to the vehicle 804. As illustrated, the vehicle 804 may be a submarine. As illustrated, at least one smart display sheet 100 may be secured to the submarine to display at least one image. The at least one image may be similar to a surrounding environment to provide some degree of camouflage for the submarine. Further, as set forth above, the temperature control coil 800 may be configured to heat and/or cool the smart display sheet 100 to maintain a temperature of the smart display sheet 100 within the operating temperature range.

Figure 9:
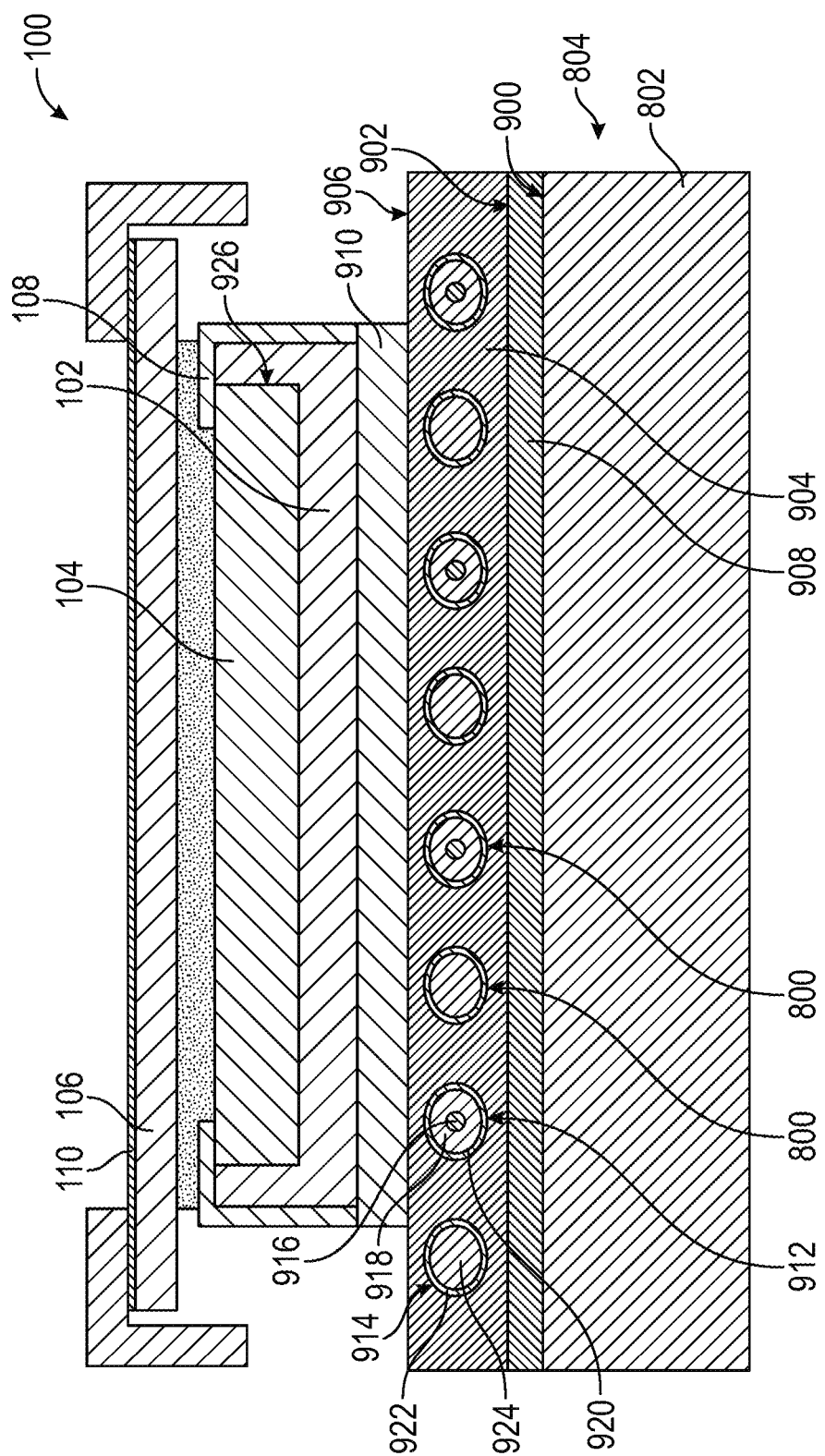
FIG. 9 illustrates a cross-sectional view of a temperature control coil secured to an outer surface of the vehicle, in accordance with embodiments of the present disclosure.

FIG. 9 illustrates a cross-sectional view of the temperature control coil 800 secured to an outer surface 900 of the vehicle 804, in accordance with embodiments of the present disclosure. As illustrated, the at least one temperature control coil 800 may be secured to the outer surface 900 of the body 802 of the vehicle 804 in a position proximate the smart display sheet 100. An inner side of the at least one temperature control coil 800 may+be secured to the outer surface 900 of the body 802 of the vehicle 804. In particular, an inner side 902 of a control coil housing 904 may be secured to the outer surface 900 of the body 802 of the vehicle 804. Alternatively, each temperature control coil 800 may be secured directly to the outer surface 900 of the body 802. Further, an outer side of the at least one temperature control coil 800 may be secured to the smart display sheet 100. In particular, an outer side 906 of the control coil housing 904 may be secured to the smart display sheet 100 (e.g., the substrate 102, the frame 108, or other suitable surface of the smart display sheet 100). That is, the at least one temperature control coil 800 and/or control coil housing 904 may contact an outer surface the smart display sheet on a side disposed opposite the display panel 104 of the smart display sheet 100, such that the at least one image produced by the smart display sheet is not obstructed by the temperature control coil 800 and/or control coil housing 904. Additionally, in some embodiments, each temperature control coil 800 may be secured directly to the smart display sheet 100.

Further, the at least one temperature control coil 800 may secured to the outer surface 900 of the body 802 of the vehicle 804 via any suitable adhesive and/or fastener. Similarly, the at least one temperature control coil 800 may be secured to the smart display sheet 100 via any suitable adhesive and/or fastener. In the illustrated embodiment, the control coil housing 904 (e.g., that houses the at least one temperature control coil 800) is secured to the outer surface 900 of the body 802 of the vehicle 804 via a first adhesive 908, and the control coil housing 904 is secured to the smart display sheet 100 via a second adhesive 910. The adhesives and/or fasteners may comprise thermally conductive material such that heating and/or cooling may be transferred through the adhesives and/or fasteners 908, 910 to the smart display sheet 100 from the at least one temperature control coil 800. Further, in some embodiments, the adhesives 908, 910 may include a Cyanoacrylate adhesive, a polyurethane adhesive, an acrylic-based adhesive, an epoxy-based adhesive, a urethane-based adhesive, a structural adhesive, tapes, films, threadlockers, flex glues, vehicle superglues, vehicle trim adhesives, plastic bonder adhesives, gap fillers, liquid gaskets or combinations thereof, as set forth above.

Indeed, the at least one temperature control coil 800 may be configured to heat and/or cool the smart display sheet 100 via conduction. In some embodiments, the at least one temperature control coil 800 may interface with a surface (e.g., the substrate 102) of the smart display sheet 100. The at least one temperature control coil 800 may be configured to heat and/or cool the smart display sheet 100 via conduction at the interface between the at least one temperature control coil 800 and the surface of the smart display sheet 100.

As illustrated, the at least one temperature control coil 800 may include a plurality of heating coils 912 and cooling coils 914 disposed in the control coil housing 904. The heating coils 912 may include a resistance heating element 916 disposed within an electrical insulator 918. Further, the electrical insulator 918 may be disposed within a metal casing 920. The metal casing 920 may be disposed within the control coil housing 904. Each of the electrical insulator 918, the metal casing 920, and the control coil housing 904 may include thermally conductive materials such that the heating coil may heat the smart display sheet 100 via conduction. Moreover, the cooling coils 914 may include thermally conductive tubing 922 having a central bore configured to provide a fluid path for cooling fluid 924. The cooling fluid 924 may be cooled via an vehicle air conditioning system (not shown) and/or a separate cooling system (not shown) disposed in the vehicle 804. Alternatively, the cooling coils 914 may include a thermally conductive coil (e.g., metal coil) extending through the control coil housing 904. The thermally conductive coil may be cooled via conduction from contract with a cold portion of the vehicle air conditioning system and/or the separate cooling system disposed in the vehicle 804, such that the thermally conductive coil may provide cooling to the smart display sheet 100. However, any suitable heating coil and or cooling coil assemblies may be used to heat and/or cool the smart display sheet 100 via conduction. The heating coils 912 and cooling coils 914 may have any suitable arrangement, including, circulate type, square type, and rectangular type. In addition, heating cools 912 and cooling coils 914 may be disposed adjacent to one another as shown on FIG. 9 or, alternatively, on top of one another.

As set forth in greater detail above, the smart display sheet 100 may include the substrate layer 102 comprising a display recess 926 and the display panel 104 disposed within the display recess 926 of the substrate layer 102. The display panel 104 is capable of displaying the at least one image. Further, the smart display sheet 100 may include the transparent cover layer 106 disposed on the display panel 104 and the frame 108 disposed against an exterior surface of the substrate layer 102. The frame 108 may be configured to hold the display panel 104 within the display recess 926 of the substrate layer 102. Additionally, the smart display sheet 100 may include the protective layer 110 disposed adjacent to the transparent cover layer 106 and configured to protect the at least one display panel 104 from environmental elements comprising heat and cold. Further, the protective layer 110 and/or the cover layer 106 may comprise bulletproof or bullet-resistant materials, which may help protect the smart display sheet. In some embodiments, the bulletproof or bullet-resistant materials is flexible. The bulletproof or bullet-resistant materials may include high performance bullet-proof glass, light-weight composite armor, ballistic proof steel, ballistic proof nylon, aramid fibers (e.g., Kevlar® fibers), and polycarbonate thermoplastics (Lexan® polycarbonate), etc. To further protect the vehicle 804, the protective layer 110 may include a hard-spall layer, for example, to prevent fragments/shards from penetrating the passenger compartment. For airplanes, for example, a light-weight polyethylene composite armor may be combined with a waterproof lightweight shield for the protective layer 110. Alternatively, the smart display sheet 100 may comprise any suitable assembly for displaying at least one image on the vehicle 804.

Figure 10:
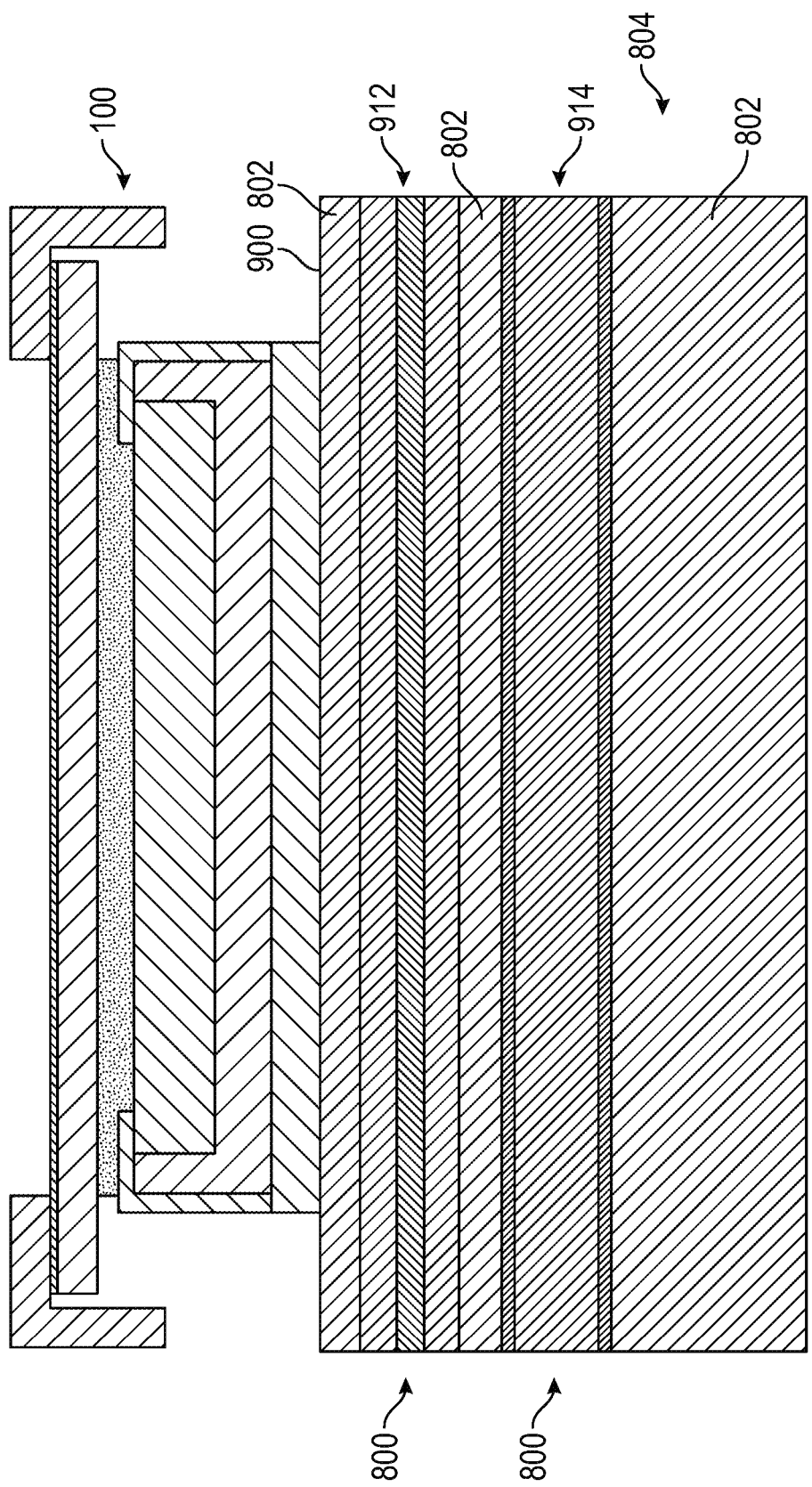
FIG. 10 illustrates a cross-sectional view of the vehicle with temperature control coils manufactured within a body of the vehicle and the smart display sheet secured to an outer surface of the vehicle, in accordance with embodiments of the present disclosure.

FIG. 10 illustrates a cross-sectional view of the vehicle 804 with temperature control coils 800 manufactured within the body 802 of the vehicle 804 and the smart display sheet 100 secured to the outer surface 900 of the vehicle 804, in accordance with embodiments of the present disclosure. As illustrated, the at least one temperature control coil 800 may be disposed within the body 802 of the vehicle 804. That is, during manufacturing of the body 802 of the vehicle 804, the at least one temperature control coil 800 may be formed or inserted within the body 802. Further, the smart display sheet 100 may be secured to the outer surface 900 of the body 802 of the vehicle 804. During operation, the at least one temperature control coil 800 is configured to conduct heat and/or cold through the body 802 of the vehicle 804 to the smart display sheet 100 to heat and/or cool the smart display sheet 100.

As illustrated, the at least one temperature control coil 800 includes at least one heating coil 912 and at least one cooling coil 914. In the illustrated embodiment, the heating coil 912 is disposed closer to the outer surface 900 of the body 802 than the cooling coil 914. Alternatively, the cooling coil 914 may be disposed closer to the outer surface 900 of the body 802 than the cooling coil 914. In some embodiments, the heating coil 912 and the cooling coil 914 may be disposed side by side such that both the heating coil 912 and the cooling coil 914 are disposed at substantially the same distance from the outer surface 900 of the body 802. Proximity of the at least one temperature control coil 800 to the outer surface 900 of the body 802 may be correlated to the efficiency of heat transfer from the at least one temperature control coil 800 to the smart display sheet 100.

Figure 11:
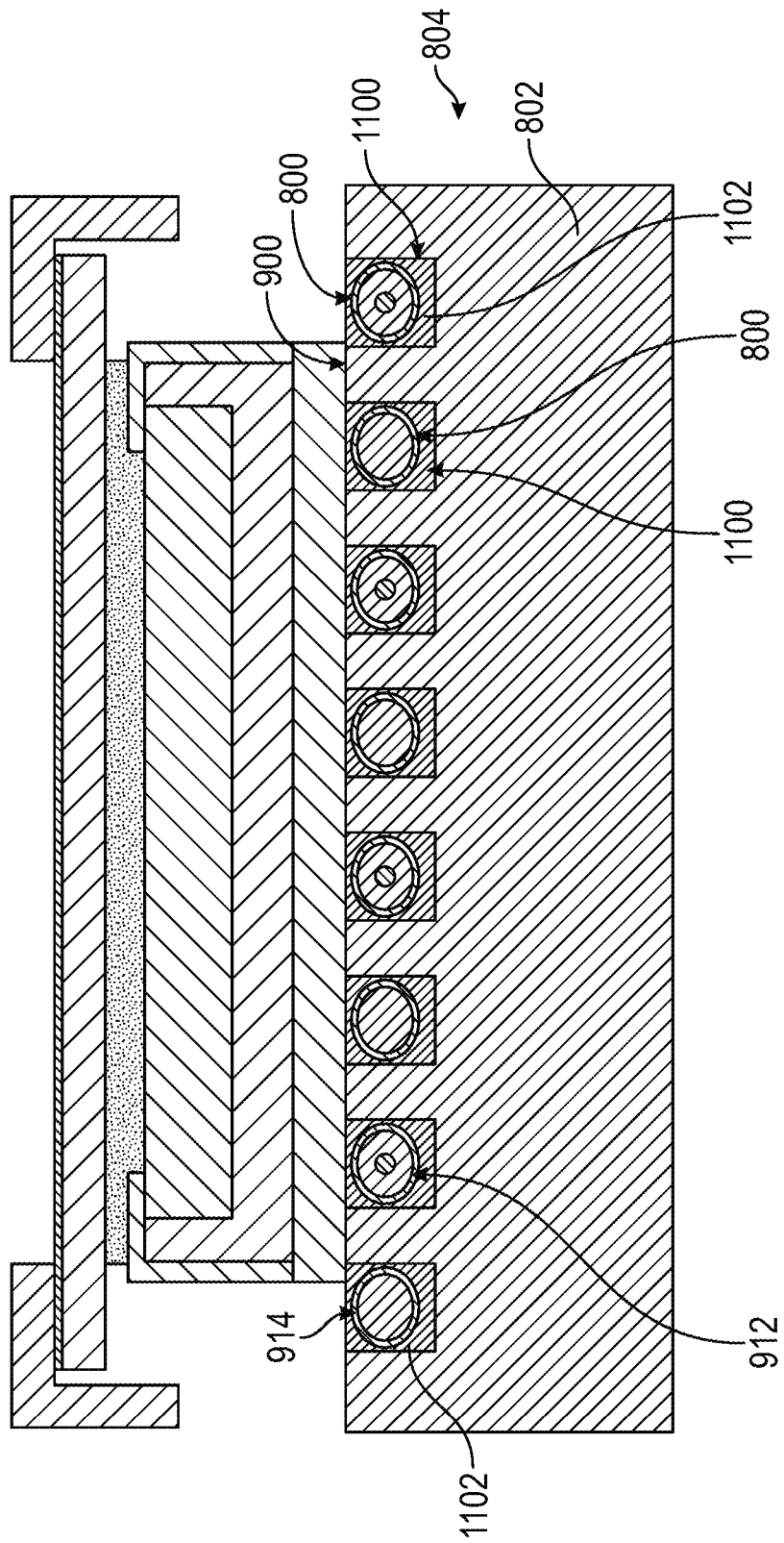
FIG. 11 illustrates a cross-sectional view of a temperature control coil secured within a recess formed in an outer surface of the vehicle, in accordance with embodiments of the present disclosure.

FIG. 11 illustrates a cross-sectional view of a temperature control coil 800 secured within at least one recess 1100 formed in the outer surface 900 of the vehicle 804, in accordance with embodiments of the present disclosure. As illustrated, the body 802 of the vehicle 804 may include a plurality of recesses 1100 formed in the outer surface 900 of the body 802. The heating coils 912 and cooling coils 914 of the at least one temperature control coil 800 may be disposed in corresponding recesses 1100 of the plurality of recesses 1100. The heating coils 912 and/or cooling coils 914 may be secured within the plurality of recesses 1100 via a press fit. Alternatively, as illustrated, the heating coils 912 and the cooling coils 914 may be secured within the corresponding recesses 1100 via a thermally conductive sealant 1102 or adhesive. The thermally conductive sealant 1102 may secure the heating coils 912 and cooling coils 914 within the corresponding recesses 1100, as well as seal the recesses 1100 to help prevent corrosion of the body 802 of the vehicle 804.

Figure 12:
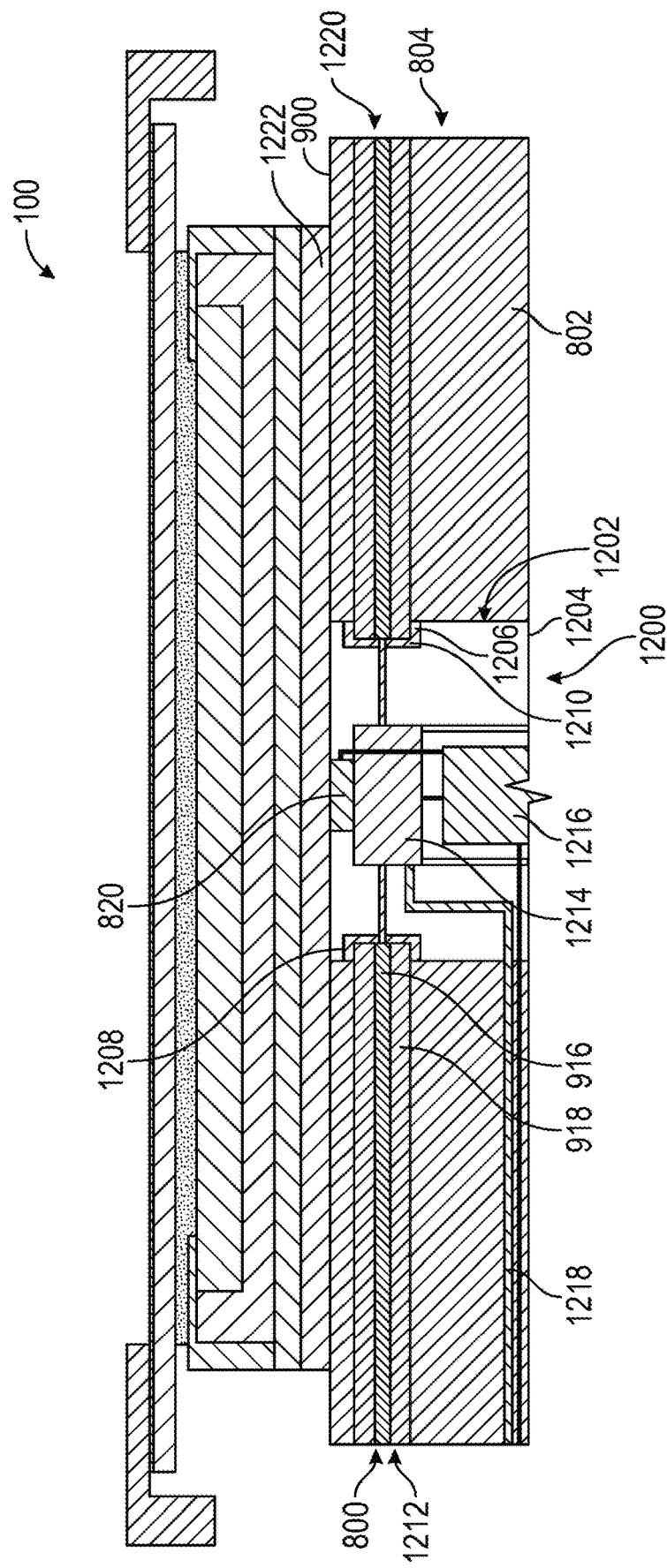
FIG. 12 illustrates a cross-sectional view of a control node secured to the vehicle, in accordance with embodiments of the present disclosure.

FIG. 12 illustrates a cross-sectional view of a control node 1200 secured to the vehicle 804, in accordance with embodiments of the present disclosure. As illustrated, the control node 1200 may be disposed within a node recess 1202 formed in the body 802 of the vehicle 804. Alternatively, the control node 1200 may be disposed withing the body 802 of the vehicle 804 or secured to the outer surface 900 of the vehicle 804. The control node 1200 may comprise a control node housing 1204. The control node housing 1204 may have at least one connection port 1206 to couple the at least one control node 1200 to at least one temperature control coil 800. In the illustrated embodiment, the control node housing 1204 comprises two connection ports 1206 (e.g., a first connection port 1208 and a second connection port 1210). However, the control node housing 1204 may include a suitable number of connection ports 1206. The connection ports 1206 may be configured to receive at least a portion of the at least one temperature control coil 800. For example, in the illustrated embodiment, the first connection port is configured to receive the electrical insulator 918 and the resistance heating element 916 of a first heating coil 1212.

Further, the control node housing 1204 may be configured to house a switch 1214 and the at least one control system 1216. The switch 1214 may be electrically connected to the resistance heating element 916 of the first heating coil 1212. Additionally, the switch 1214 may be connected to a power source (not shown) of the vehicle 804 or any other suitable power source via a power line 1218. The at least one control system 1216 may be configured to control the switch 1214 to electrically connect the power source to the first heating coil 1212 in response to determining that the first heating coil 1212 should be activated to heat the smart display sheet 100. Further, the at least one control system 1216 may be configured to instruct the switch 1214 to electrically connect the power source to only the first heating coil 1212, only a second heating coil 1220, or both the first heating coil 1212 and the second heating coil 1220.

The control node housing 1204 may further house the at least one temperature sensor 820 configured to provide a temperature signal to the at least one control system 1216. The at least one control system 1216 may be configured to determine and output activation instructions to the switch 1214 and/or directly to the at least one temperature control coil 800 based at least in part on a measured temperature sent to the at least one control system 1216 via the temperature signal from the at least one temperature sensor 820.

Additionally, the at least one control node 1200 may include a magnet 1222. As illustrated, the magnet 1222 may be disposed on an outer surface of a control node housing 1204. The magnet 1222 may be secured to the control node housing 1204 via an adhesive or other suitable fastener. However, as illustrated, the magnetic forces from the magnet 1222 may be used to secure the magnet 1222 to the control node housing 1204. Further, the smart display sheet 100 may be secured to the vehicle 804 via a magnetic attachment to the at least one control node 1200 via the magnet 1222. Having the smart display sheet 100 attached to the vehicle 804 via the magnet 1222 may allow for smart display sheets 100 to be removed and replaced from the vehicle 804 without substantial body work to remove adhesives, fasteners, etc.

Figure 13:
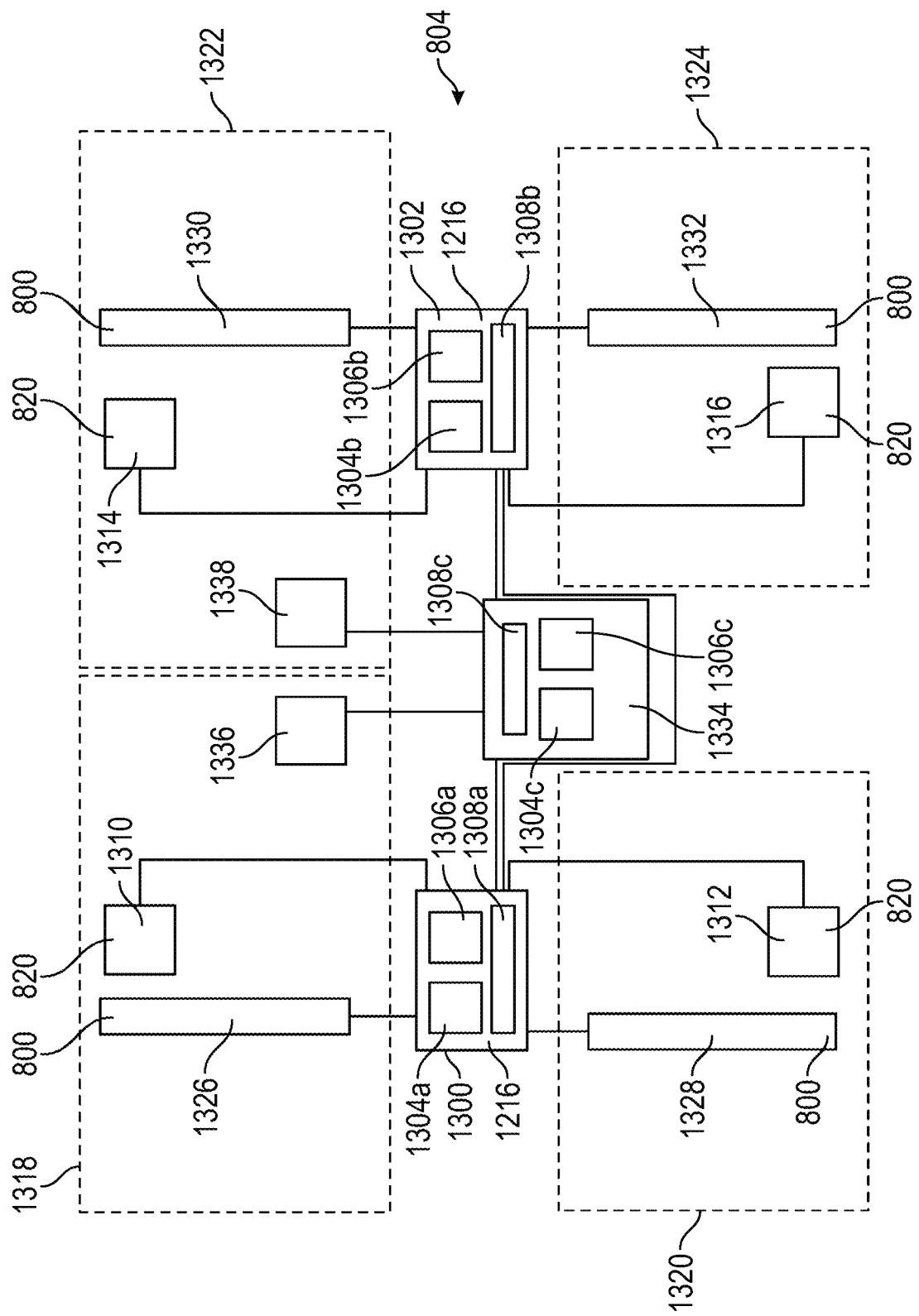
FIG. 13 illustrates a block diagram of a control system for the temperature control coils, in accordance with embodiments of the present disclosure.

FIG. 13 illustrates a block diagram of a control system for the temperature control coils, in accordance with embodiments of the present disclosure. As set forth above, the at least one control system 1216 may be configured to receive the temperature signal from the at least one temperature sensor 820 and output the instructions to the at least one temperature control coil 800 based at least in part on the received temperature signal. As illustrated, the at least one control system 1216 may include a plurality of control systems 1216 (e.g., a first control system 1300 and a second control system 1302).

Each control system 1216 may have a processor 1304 and a memory 1306. The processor 1304 may include one or more processing devices, and the memory may include one or more tangible, non-transitory, machine-readable media. By way of example, such machine-readable media can include RAM, ROM, EPROM, EEPROM, or optical disk storage, magnetic disk storage or other magnetic storage devices, or any other medium which can be used to carry or store desired program code in the form of machine-executable instructions or data structures, and which can be accessed by the processor 1304 or by other processor-based devices (e.g., mobile devices). In some embodiments, the memory 1306 is configured to store controller instructions executable by the processor 1304 to output various control system signals. For example, the processor 1304 may execute the controller instructions to control the control the switch 1214 (shown in FIG. 12), activate at least one temperature control coil 800, etc.

Moreover, the control system 1216 may be configured to output and receive signals (e.g., temperature signals, etc.) via communications circuitry 1308. The communications circuitry 1308 may include antennas, radio transceiver circuits, and signal processing hardware and/or software (e.g., hardware or software filters, A/D converters, multiplexers, amplifiers), or a combination thereof, and that may be configured to communicate over wireless communication paths via infrared (IR) wireless communication, satellite communication, broadcast radio, microwave radio, Bluetooth, Zigbee, Wifi, UHF, NFC, etc.

Moreover, as set forth above, the at least one control system 1216 may include the first control system 1300 and the second control system 1302. Further, the at least one temperature sensor 820 may include a plurality of temperature sensors (e.g., a first temperature sensor 1310, a second temperature sensor 1312, a third temperature sensor 1314, and a fourth temperature sensor 1316) having at least one temperature sensor 820 disposed in each control region (e.g., first control region 1318, second control region 1320, third control region 1322, and fourth control region 1324) of the vehicle 804. Additionally, the at least one temperature control coil 800 may include a plurality of temperature control coils (e.g., a first temperature coil 1326, a second temperature coil 1328, a third temperature coil 1330, and a fourth temperature coil 1332) having at least one temperature control coil disposed in each control region of the vehicle 804. The at least one control system 1216 (e.g., the first control system 1300 and the second control system 1302) may be configured to output separate instructions to the temperature control coils 800 corresponding to each control region based at least in part on respective measured temperatures from the corresponding at least one temperature sensors disposed in each control region.

For example, the first control system 1300 may be configured to receive a first temperature signal from the first temperature sensor 1310 disposed in a first control region 1318 of the vehicle 804. The first control region 1318 may correspond to the hood 806 (shown in FIG. 8) of the vehicle 804. The first temperature signal may indicate that the temperature at the first control region 1318 is thirty degrees Fahrenheit. As such, the first control system 1300 may output a first instruction to activate the first temperature coil 1326. Additionally, the first control system 1300 may be configured to receive a second temperature signal from the second temperature sensor 1312 disposed in a second control region 1320 of the vehicle 804. The second control region 1320 may correspond to the roof 810 (shown in FIG. 8) of the vehicle 804. The second temperature signal may indicate that the temperature at the second control region 1320 is thirty-three degrees Fahrenheit. As such, the first control system 1300 may output a second instruction to de-activate the second temperature coil 1328 since the second control region 1320 is within an operating temperature range of 32-95 degrees Fahrenheit.

Moreover, the second control system 1302 may be configured to receive a third temperature signal from the third temperature sensor 1314 disposed in a third control region 1322 of the vehicle 804. The third control region 1322 may correspond to the side panel 818 (shown in FIG. 8) of the vehicle 804. The third temperature signal may indicate that the temperature at the third control region 1322 is twenty-nine degrees Fahrenheit. As such, the second control system 1302 may output a third instruction to activate the third temperature coil 1330. Additionally, the second control system 1302 may be configured to receive a fourth temperature signal from the fourth temperature sensor 1316 disposed in a fourth control region 1324 of the vehicle 804. The fourth control region may correspond to the trunk 816 (shown in FIG. 8) of the vehicle 804. The fourth temperature signal may indicate that the temperature at the fourth control region 1324 is thirty-four degrees Fahrenheit. As such, the second control system 1302 may output a fourth instruction to de-activate the fourth temperature coil 1332 since the fourth control region 1324 is within an operating temperature range of 32-95 degrees Fahrenheit.

Alternatively, or additionally, the at least one control system 1216 may be configured to output instructions to activate the temperature control coils 800 in response to user input. That is, the at least one control system 1216 may receive user input from a user interface (e.g., the control console 604 shown in FIG. 6) disposed within the vehicle 804 and output the instructions to the at least one temperature control coil 800 based at least in part on the user input. The user interface may include an input/output device (e.g., keyboard, mouse, or touch screen) configured to provide the user input to the at least one control system. Further, the user interface may include the console display 606 (shown in FIG. 6) configured to display user options for the at least one control system 1216. That is, the user interface may display options to manually activate any desired temperature control coil 800.

Further, the at least one control system 1216 may be further configured to receive a vehicle input comprising additional data. That is, the at least one control system 1216 may be configured to communicate with a vehicle computer 1334. The vehicle computer 1334 may send the additional data (e.g., proximity data, vehicle velocity data, weather data, or other suitable data) to the at least one control system 1216 via a proximity sensor 1336, an accelerometer 1338, or any other suitable sensor and/or input device. The at least one control system 1216 may be configured to output the instructions to the at least one temperature control coil 800 based at least in part on a combination of the received temperature signal and the additional data. Moreover, the first control system 1300 may be configured to receive data from the second control system 1302 and vice versa.

Accordingly, the present disclosure may provide a system for heating and/or cooling smart display sheets on a vehicle. The systems may include any of the various features disclosed herein, including one or more of the following statements.

Statement 1. A system, comprising: at least one temperature control coil secured to a body of a vehicle in a position proximate a smart display sheet, wherein the temperature control coil is configured to heat and/or cool the smart display sheet to maintain a temperature of the smart display sheet within an operating temperature range; and a control system configured to output instructions to control the temperature control coil.

Statement 2. The system of statement 1, wherein the at least one temperature control coil comprises a heating coil, a cooling coil, or some combination thereof.

Statement 3. The system of statement 1 or statement 2, wherein the at least one temperature control coil interfaces with a surface of the smart display sheet, and wherein the at least one temperature control coil is configured to heat and/or cool the smart display sheet via conduction at the interface between the at least one temperature control coil and the surface of the smart display sheet.

Statement 4. The system of any preceding statement, wherein the at least one temperature control coil contacts a side of an outer surface of a frame of the smart display sheet disposed opposite a display panel of the smart display sheet.

Statement 5. The system of any preceding statement, wherein the control system is configured to output instructions to activate the temperature control coil in response to user input.

Statement 6. The system of any preceding statement, wherein the operating temperature range is between 32-95 degrees Fahrenheit.

Statement 7. The system of any of statements 1-2 or 5-6, wherein the at least one temperature control coil is disposed within the body of the vehicle, wherein the smart display sheet is secured to an outer surface of the body of the vehicle, and wherein the at least one temperature control coil is configured to conduct heat and/or cold through the body of the vehicle to the smart display sheet.

Statement 8. The system of any of statements 1-6, wherein the at least one temperature control coil is disposed within at least one recess formed in an outer surface of the body of the vehicle.

Statement 9. The system of any of statements 1-6, wherein an inner side of the at least one temperature control coil is secured to an outer surface of the body of the vehicle, and wherein an outer side of the at least one temperature control coil is secured to the smart display sheet.

Statement 10. The system of any preceding statement, wherein the vehicle comprises a car, truck, sports utility vehicle, or some combination thereof.

Statement 11. The system of any preceding statement, wherein the smart display sheet comprises: a substrate layer comprising a recess; a display panel disposed within the recess of the substrate layer, wherein the display panel is capable of displaying the at least one image; a transparent cover layer disposed on the display panel; a frame disposed against an exterior surface of the substrate layer, wherein the frame is configured to hold the display panel within the recess of the substrate layer; and a protective layer disposed adjacent to the transparent cover layer and configured to protect the at least one display panel from environmental elements comprising heat and cold.

Statement 12. A system, comprising: at least one temperature control coil secured to a body of a vehicle in a position proximate a smart display sheet, wherein the temperature control coil is configured to heat and/or cool the smart display sheet to maintain a temperature of the smart display sheet within an operating temperature range; at least one temperature sensor disposed on the vehicle, wherein the at least one temperature sensor is configured to output a temperature signal comprising a measured temperature at a location of the sensor on the vehicle; and at least one control system configured to receive the temperature signal and output the instructions to the at least one temperature control coil based at least in part on the received temperature signal.

Statement 13. The system of statement 12, wherein the at least one temperature sensor comprises a plurality of temperature sensors having at least one temperature sensor disposed in each control region of the vehicle, wherein the at least one temperature control coil comprises a plurality of temperature control coils having at least one temperature control coil disposed in each control region of the vehicle, and wherein the at least one control system is configured to output separate instructions to the at least one temperature control coil of each region based at least in part on respective measured temperatures from the corresponding at least one temperature sensors disposed in each region.

Statement 14. The system of statement 12 or statement 13, wherein the at least one control system is further configured to receive user input from a user interface disposed within the vehicle, wherein the at least one control system is configured to output the instructions to the at least one temperature control coil based at least in part on the user input.

Statement 15. The system of any of statements 12-14, wherein the at least one control system is further configured to receive a vehicle input comprising additional data, wherein the additional data comprises proximity data, vehicle velocity data, or some combination thereof, and wherein the at least one control system is configured to output the instructions to the at least one temperature control coil based at least in part on the received temperature signal and the additional data.

Statement 16. The system of any of statements 12-15, wherein the smart display sheet comprises: a substrate layer comprising a recess; a display panel disposed within the recess of the substrate layer, wherein the display panel is capable of displaying the at least one image; a transparent cover layer disposed on the display panel; a frame disposed against an exterior surface of the substrate layer, wherein the frame is configured to hold the display panel within the recess of the substrate layer; and a protective layer disposed adjacent to the transparent cover layer and configured to protect the at least one display panel from environmental elements comprising heat and cold.

Statement 17. A system, comprising: a smart display sheet configured to display at least one image; at least one temperature control coil secured to a body of a vehicle, wherein the smart display sheet is secured to at least one temperature control coil, and wherein the temperature control coil is configured to heat and/or cool the smart display sheet to maintain a temperature of the smart display sheet within an operating temperature range; and at least one control system configured to output instructions to control the temperature control coil.

Statement 18. The system of statement 17, wherein the at least one control system is disposed within at least one control node, wherein the control node comprises a housing with at least one connection port to couple the at least one control node to at least one temperature control coil.

Statement 19. The system of statement 17 or statement 18, wherein the at least one control node comprises a magnet disposed on an outer surface of a housing of the control node, wherein the smart display sheet is magnetically attached to the at least one control node.

Statement 20. The system of any of statements 17-19, wherein the smart display sheet comprises: a substrate layer comprising a recess; a display panel disposed within the recess of the substrate layer, wherein the display panel is capable of displaying the at least one image; a transparent cover layer disposed on the display panel; a frame disposed against an exterior surface of the substrate layer, wherein the frame is configured to hold the display panel within the recess of the substrate layer; and a protective layer disposed adjacent to the transparent cover layer and configured to protect the at least one display panel from environmental elements comprising heat and cold.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present embodiments are well adapted to attain the ends and advantages mentioned as well as those that are inherent therein. The particular embodiments disclosed above are illustrative only, as the present embodiments may be modified and practiced in different but equivalent manners apparent to those skilled in the art having the benefit of the teachings herein. Although individual embodiments are discussed, all combinations of each embodiment are contemplated and covered by the disclosure. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative embodiments disclosed above may be altered or modified and all such variations are considered within the scope and spirit of the present disclosure.

What is claimed is:

1. A system, comprising:
a plurality of smart display sheets;
a plurality of temperature control coils secured to a body of a vehicle in respective positions proximate corresponding smart display sheets of the plurality of smart display sheets, wherein each temperature control coil of the plurality of temperature control coils is configured to heat and/or cool a corresponding smart display sheet to maintain a temperature of the corresponding smart display sheet within an operating temperature range, and wherein the plurality of temperature control coils includes a first temperature control coil disposed in a first control region of the vehicle and a second temperature control coil disposed in a second region of the vehicle, wherein the first control region includes a hood of the vehicle and the second control region includes a roof of the vehicle; and a control system configured to output instructions to control each temperature control coil.

2. The system of claim 1, wherein the plurality of temperature control coils comprises heating coils, cooling coils, or some combination thereof.

3. The system of claim 1, wherein each temperature control coil of the plurality of temperature control coils interfaces with a surface of the corresponding smart display sheet, and wherein each temperature control coil is configured to heat and/or cool the corresponding smart display sheet via conduction at the interface between the temperature control coil and the surface of the corresponding smart display sheet.

4. The system of claim 1, wherein each temperature control coil of the plurality of temperature control coils contacts a side of an outer surface of a frame of the corresponding smart display sheet disposed opposite a display panel of the corresponding smart display sheet.

5. The system of claim 1, wherein the control system is configured to output instructions to activate each temperature control coil in response to user input.

6. The system of claim 1, wherein the operating temperature range is between 32-95 degrees Fahrenheit.

7. The system of claim 1, wherein each temperature control coil of the plurality of temperature control coils is disposed within the body of the vehicle, wherein the smart display sheets are secured to an outer surface of the body of the vehicle, and wherein each temperature control coil is configured to conduct heat and/or cold through the body of the vehicle to the corresponding smart display sheet.

8. The system of claim 1, wherein each temperature control coil of the plurality of temperature control coils is disposed within at least one recess formed in an outer surface of the body of the vehicle.

9. The system of claim 1, wherein an inner side of each temperature control coil of the plurality of temperature control coils is secured to an outer surface of the body of the vehicle, and wherein an outer side of each temperature control coil is secured to the corresponding smart display sheet.

10. The system of claim 1, wherein the vehicle comprises a car, truck, sports utility vehicle, or some combination thereof.

11. The system of claim 1, wherein each smart display sheet of the plurality of smart display sheets comprises:
a substrate layer comprising a recess;
a display panel disposed within the recess of the substrate layer, wherein the display panel is capable of displaying the at least one image;
a transparent cover layer disposed on the display panel;
a frame disposed against an exterior surface of the substrate layer, wherein the frame is configured to hold the display panel within the recess of the substrate layer; and
a protective layer disposed adjacent to the transparent cover layer and configured to protect the at least one display panel from environmental elements comprising heat and cold.

12. A system, comprising:
a smart display sheet configured to display at least one image;
at least one control node housing secured to a body of a vehicle, wherein the control node housing comprises at least one connection port;
at least one temperature control coil secured to a body of a vehicle in a position proximate a smart display sheet, wherein the at least one temperature control coil is coupled to the at least one connection port, and wherein the temperature control coil is configured to heat and/or cool the smart display sheet to maintain a temperature of the smart display sheet within an operating temperature range;
at least one temperature sensor disposed within the at least one control node housing, wherein the at least one temperature sensor is configured to output a temperature signal comprising a measured temperature at a location of the sensor on the vehicle;
at least one control system disposed within the control node housing, wherein the at least one control system is coupled to the at least one temperature control coil via the at least one connection port, and wherein the at least one control system is configured to receive the temperature signal and output the instructions to the at least one temperature control coil based at least in part on the received temperature signal;
wherein the vehicle comprises a plurality of control regions, wherein a first control region includes a hood of the vehicle, wherein a second control region includes a roof of the vehicle, wherein a third control region includes a side panel of the vehicle, and wherein a fourth control region corresponds to a trunk of the vehicle; and
wherein the at least one temperature sensor comprises a plurality of temperature sensors having at least one temperature sensor disposed in a corresponding control node housing in each control region of the vehicle, wherein the at least one temperature control coil comprises a plurality of temperature control coils having at least one temperature control coil disposed in each control region of the vehicle, and wherein the at least one control system is configured to output separate instructions to the at least one temperature control coil of each region based at least in part on respective measured temperatures from the corresponding at least one temperature sensors disposed in each region.

13. The system of claim 12, wherein the at least one control system is further configured to receive user input from a user interface disposed within the vehicle, wherein the at least one control system is configured to output the instructions to the at least one temperature control coil based at least in part on the user input.

14. The system of claim 12, wherein the at least one control system is further configured to receive a vehicle input comprising additional data, wherein the additional data comprises proximity data, vehicle velocity data, or some combination thereof, and wherein the at least one control system is configured to output the instructions to the at least one temperature control coil based at least in part on the received temperature signal and the additional data.

15. The system of claim 12, wherein the smart display sheet comprises:

a substrate layer comprising a recess;

a display panel disposed within the recess of the substrate layer, wherein the display panel is capable of displaying the at least one image;

a transparent cover layer disposed on the display panel;

a frame disposed against an exterior surface of the substrate layer, wherein the frame is configured to hold the display panel within the recess of the substrate layer; and a protective layer disposed adjacent to the transparent cover layer and configured to protect the at least one display panel from environmental elements comprising heat and cold.

* * * * *